(12) United States Patent
Costa et al.

(10) Patent No.: US 10,985,033 B2
(45) Date of Patent: Apr. 20, 2021

(54) SEMICONDUCTOR PACKAGE WITH REDUCED PARASITIC COUPLING EFFECTS AND PROCESS FOR MAKING THE SAME

(71) Applicant: Qorvo US, Inc., Greensboro, NC (US)

(72) Inventors: Julio C. Costa, Oak Ridge, NC (US); George Maxim, Saratoga, CA (US); Dirk Robert Walter Leipold, San Jose, CA (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/975,230

(22) Filed: May 9, 2018

(65) Prior Publication Data

US 2018/0261470 A1    Sep. 13, 2018

Related U.S. Application Data

(62) Division of application No. 15/498,040, filed on Apr. 26, 2017, now Pat. No. 10,109,502.
(Continued)

(51) Int. Cl.
*H01L 21/56* (2006.01)
*H01L 23/31* (2006.01)
(Continued)

(52) U.S. Cl.
CPC ......... *H01L 21/561* (2013.01); *H01L 23/295* (2013.01); *H01L 23/3114* (2013.01);
(Continued)

(58) Field of Classification Search
None
See application file for complete search history.

(56) References Cited

U.S. PATENT DOCUMENTS 4,093,562 A    6/1978 Kishimoto
4,366,202 A    12/1982 Borovsky
(Continued)

FOREIGN PATENT DOCUMENTS

CN    102956468 A    3/2013
CN    103811474 A    5/2014
(Continued)

OTHER PUBLICATIONS

First Office Action for Chinese Patent Application No. 201510746323.X, dated Nov. 2, 2018, 12 pages.
(Continued)

*Primary Examiner* — Long Pham
(74) *Attorney, Agent, or Firm* — Withrow & Terranova, P.L.L.C.

(57) ABSTRACT

The present disclosure relates to a semiconductor package with reduced parasitic coupling effects, and a process for making the same. The disclosed semiconductor package includes a thinned flip-chip die and a first mold compound component with a dielectric constant no more than 7. The thinned flip-chip die includes a back-end-of-line (BEOL) layer with an upper surface that includes a first surface portion and a second surface portion surrounding the first surface portion, a device layer over the upper surface of the BEOL layer, and a buried oxide (BOX) layer over the device layer. The BEOL layer includes a first passive device and a second passive device, which are underlying the first surface portion and not underlying the second surface portion. Herein, the first mold compound component extends through the BOX layer and the device layer to the first surface portion.

20 Claims, 17 Drawing Sheets

Related U.S. Application Data

(60) Provisional application No. 62/393,201, filed on Sep. 12, 2016.

(51) Int. Cl.
*H01L 23/522* (2006.01)
*H01L 49/02* (2006.01)
*H01L 29/06* (2006.01)
*H01L 29/78* (2006.01)
*H01L 23/29* (2006.01)

(52) U.S. Cl.
CPC ...... *H01L 23/3135* (2013.01); *H01L 23/5223* (2013.01); *H01L 28/40* (2013.01); *H01L 29/0649* (2013.01); *H01L 29/78* (2013.01); H01L 23/5222 (2013.01); H01L 2224/11002 (2013.01); H01L 2224/16227 (2013.01); H01L 2224/16245 (2013.01); H01L 2224/32225 (2013.01); H01L 2224/32245 (2013.01); H01L 2224/73204 (2013.01); H01L 2224/92125 (2013.01); H01L 2924/1306 (2013.01); H01L 2924/18161 (2013.01)

(56) References Cited

U.S. PATENT DOCUMENTS

| | | |
|---|---|---|
| 5,013,681 A | 5/1991 | Godbey et al. |
| 5,061,663 A | 10/1991 | Bolt et al. |
| 5,069,626 A | 12/1991 | Patterson et al. |
| 5,362,972 A | 11/1994 | Yazawa et al. |
| 5,391,257 A | 2/1995 | Sullivan et al. |
| 5,459,368 A | 10/1995 | Onishi et al. |
| 5,646,432 A | 7/1997 | Iwaki et al. |
| 5,648,013 A | 7/1997 | Uchida et al. |
| 5,699,027 A | 12/1997 | Tsuji et al. |
| 5,709,960 A | 1/1998 | Mays et al. |
| 5,729,075 A | 3/1998 | Strain |
| 5,831,369 A | 11/1998 | Fürbacher et al. |
| 5,920,142 A | 7/1999 | Onishi et al. |
| 6,072,557 A | 6/2000 | Kishimoto |
| 6,084,284 A | 7/2000 | Adamic, Jr. |
| 6,154,366 A | 11/2000 | Ma et al. |
| 6,154,372 A | 11/2000 | Kalivas et al. |
| 6,235,554 B1 | 5/2001 | Akram et al. |
| 6,236,061 B1 | 5/2001 | Walpita |
| 6,268,654 B1 | 7/2001 | Glenn et al. |
| 6,271,469 B1 | 8/2001 | Ma et al. |
| 6,377,112 B1 | 4/2002 | Rozsypal |
| 6,423,570 B1 | 7/2002 | Ma et al. |
| 6,426,559 B1 | 7/2002 | Bryan et al. |
| 6,441,498 B1 | 8/2002 | Song |
| 6,446,316 B1 | 9/2002 | Fürbacher et al. |
| 6,578,458 B1 | 6/2003 | Akram et al. |
| 6,649,012 B2 | 11/2003 | Masayuki et al. |
| 6,703,688 B1 | 3/2004 | Fitzergald |
| 6,713,859 B1 | 3/2004 | Ma |
| 6,841,413 B2 | 1/2005 | Liu et al. |
| 6,864,156 B1 | 3/2005 | Conn |
| 6,902,950 B2 | 6/2005 | Ma et al. |
| 6,943,429 B1 | 9/2005 | Glenn et al. |
| 6,964,889 B2 | 11/2005 | Ma et al. |
| 6,992,400 B2 | 1/2006 | Tikka et al. |
| 7,042,072 B1 | 5/2006 | Kim et al. |
| 7,049,692 B2 | 5/2006 | Nishimura et al. |
| 7,109,635 B1 | 9/2006 | McClure et al. |
| 7,183,172 B2 | 2/2007 | Lee et al. |
| 7,190,064 B2 | 3/2007 | Wakabayashi et al. |
| 7,238,560 B2 | 7/2007 | Sheppard et al. |
| 7,279,750 B2 | 10/2007 | Jobetto |
| 7,288,435 B2 | 10/2007 | Aigner et al. |
| 7,307,003 B2 | 12/2007 | Reif et al. |
| 7,393,770 B2 | 7/2008 | Wood et al. |
| 7,402,901 B2 | 7/2008 | Hatano et al. |
| 7,427,824 B2 | 9/2008 | Iwamoto et al. |
| 7,489,032 B2 | 2/2009 | Jobetto |
| 7,596,849 B1 | 10/2009 | Carpenter et al. |
| 7,619,347 B1 | 11/2009 | Bhattacharjee |
| 7,635,636 B2 | 12/2009 | McClure et al. |
| 7,714,535 B2 | 5/2010 | Yamazaki et al. |
| 7,749,882 B2 | 7/2010 | Kweon et al. |
| 7,790,543 B2 | 9/2010 | Abadeer et al. |
| 7,843,072 B1 | 11/2010 | Park et al. |
| 7,855,101 B2 | 12/2010 | Furman et al. |
| 7,868,419 B1 | 1/2011 | Kerr et al. |
| 7,910,405 B2 | 3/2011 | Okada et al. |
| 7,960,218 B2 | 6/2011 | Ma et al. |
| 8,004,089 B2 | 8/2011 | Jobetto |
| 8,183,151 B2 | 5/2012 | Lake |
| 8,420,447 B2 | 4/2013 | Tay et al. |
| 8,503,186 B2 | 8/2013 | Lin et al. |
| 8,643,148 B2 | 2/2014 | Lin et al. |
| 8,658,475 B1 | 2/2014 | Kerr |
| 8,664,044 B2 | 3/2014 | Jin et al. |
| 8,772,853 B2 | 7/2014 | Hong et al. |
| 8,791,532 B2 | 7/2014 | Graf et al. |
| 8,802,495 B2 | 8/2014 | Kim et al. |
| 8,803,242 B2 | 8/2014 | Marino et al. |
| 8,816,407 B2 | 8/2014 | Kim et al. |
| 8,835,978 B2 | 9/2014 | Mauder et al. |
| 8,906,755 B1 | 12/2014 | Hekmatshoartabari et al. |
| 8,921,990 B2 | 12/2014 | Park et al. |
| 8,927,968 B2 | 1/2015 | Cohen et al. |
| 8,941,248 B2 | 1/2015 | Lin et al. |
| 8,963,321 B2 | 2/2015 | Lenniger et al. |
| 8,983,399 B2 | 3/2015 | Kawamura et al. |
| 9,064,883 B2 | 6/2015 | Meyer et al. |
| 9,165,793 B1 | 10/2015 | Wang et al. |
| 9,214,337 B2 | 12/2015 | Carroll et al. |
| 9,349,700 B2 | 5/2016 | Hsieh et al. |
| 9,368,429 B2 | 6/2016 | Ma et al. |
| 9,406,637 B2 | 8/2016 | Wakisaka et al. |
| 9,461,001 B1 | 10/2016 | Tsai et al. |
| 9,520,428 B2 | 12/2016 | Fujimori |
| 9,530,709 B2 | 12/2016 | Leipold et al. |
| 9,613,831 B2 | 4/2017 | Morris et al. |
| 9,646,856 B2 | 5/2017 | Meyer et al. |
| 9,653,428 B1 | 5/2017 | Hiner et al. |
| 9,786,586 B1 | 10/2017 | Shih |
| 9,812,350 B2 | 11/2017 | Costa |
| 9,824,951 B2 | 11/2017 | Leipold et al. |
| 9,824,974 B2 | 11/2017 | Gao et al. |
| 9,859,254 B1 | 1/2018 | Yu et al. |
| 9,875,971 B2 | 1/2018 | Bhushan et al. |
| 9,941,245 B2 | 4/2018 | Skeete et al. |
| 10,134,837 B1 | 11/2018 | Fanelli et al. |
| 10,727,212 B2 | 7/2020 | Moon et al. |
| 2001/0004131 A1 | 6/2001 | Masayuki et al. |
| 2002/0070443 A1 | 6/2002 | Mu et al. |
| 2002/0074641 A1 | 6/2002 | Towle et al. |
| 2002/0127769 A1 | 9/2002 | Ma et al. |
| 2002/0127780 A1 | 9/2002 | Ma et al. |
| 2002/0137263 A1 | 9/2002 | Towle et al. |
| 2002/0185675 A1 | 12/2002 | Furukawa |
| 2003/0207515 A1 | 11/2003 | Tan et al. |
| 2004/0021152 A1 | 2/2004 | Nguyen et al. |
| 2004/0164367 A1 | 8/2004 | Park |
| 2004/0166642 A1 | 8/2004 | Chen et al. |
| 2004/0219765 A1 | 11/2004 | Reif et al. |
| 2005/0037595 A1 | 2/2005 | Nakahata |
| 2005/0077511 A1 | 4/2005 | Fitzergald |
| 2005/0079686 A1 | 4/2005 | Aigner et al. |
| 2005/0212419 A1 | 9/2005 | Vazan et al. |
| 2006/0057782 A1 | 3/2006 | Gardes et al. |
| 2006/0099781 A1 | 5/2006 | Beaumont et al. |
| 2006/0105496 A1 | 5/2006 | Chen et al. |
| 2006/0108585 A1 | 5/2006 | Gan et al. |
| 2006/0228074 A1 | 10/2006 | Lipson et al. |
| 2006/0261446 A1 | 11/2006 | Wood et al. |
| 2007/0020807 A1 | 1/2007 | Geefay et al. |
| 2007/0045738 A1 | 3/2007 | Jones et al. |
| 2007/0069393 A1 | 3/2007 | Asahi et al. |
| 2007/0075317 A1 | 4/2007 | Kato et al. |
| 2007/0121326 A1 | 5/2007 | Nall et al. |

(56) References Cited

U.S. PATENT DOCUMENTS

| | | |
|---|---|---|
| 2007/0158746 A1 | 7/2007 | Ohguro |
| 2007/0181992 A1 | 8/2007 | Lake |
| 2007/0190747 A1 | 8/2007 | Humpston et al. |
| 2007/0194342 A1 | 8/2007 | Kinzer |
| 2007/0252481 A1 | 11/2007 | Iwamoto et al. |
| 2007/0276092 A1 | 11/2007 | Kanae et al. |
| 2008/0050852 A1 | 2/2008 | Hwang et al. |
| 2008/0050901 A1 | 2/2008 | Kweon et al. |
| 2008/0164528 A1 | 7/2008 | Cohen et al. |
| 2008/0265978 A1 | 10/2008 | Englekirk |
| 2008/0272497 A1 | 11/2008 | Lake |
| 2008/0277800 A1 | 11/2008 | Hwang et al. |
| 2008/0315372 A1 | 12/2008 | Kuan et al. |
| 2009/0008714 A1 | 1/2009 | Chae |
| 2009/0010056 A1 | 1/2009 | Kuo et al. |
| 2009/0014856 A1 | 1/2009 | Knickerbocker |
| 2009/0090979 A1 | 4/2009 | Zhu et al. |
| 2009/0179266 A1 | 7/2009 | Abadeer et al. |
| 2009/0243097 A1 | 10/2009 | Koroku et al. |
| 2009/0261460 A1 | 10/2009 | Kuan et al. |
| 2009/0302484 A1 | 12/2009 | Lee et al. |
| 2010/0003803 A1 | 1/2010 | Oka et al. |
| 2010/0012354 A1 | 1/2010 | Hedin et al. |
| 2010/0029045 A1 | 2/2010 | Ramanathan et al. |
| 2010/0045145 A1 | 2/2010 | Tsuda |
| 2010/0081232 A1 | 4/2010 | Furman et al. |
| 2010/0081237 A1 | 4/2010 | Wong et al. |
| 2010/0109122 A1 | 5/2010 | Ding et al. |
| 2010/0120204 A1 | 5/2010 | Kunimoto |
| 2010/0127340 A1 | 5/2010 | Sugizaki |
| 2010/0173436 A1 | 7/2010 | Ouellet et al. |
| 2010/0200919 A1 | 8/2010 | Kikuchi |
| 2010/0314637 A1 | 12/2010 | Kim et al. |
| 2011/0003433 A1 | 1/2011 | Harayama et al. |
| 2011/0026232 A1 | 2/2011 | Lin et al. |
| 2011/0036400 A1 | 2/2011 | Murphy et al. |
| 2011/0062549 A1 | 3/2011 | Lin |
| 2011/0068433 A1 | 3/2011 | Kim et al. |
| 2011/0102002 A1 | 5/2011 | Riehl et al. |
| 2011/0171792 A1 | 7/2011 | Chang et al. |
| 2011/0272800 A1 | 11/2011 | Chino |
| 2011/0272824 A1 | 11/2011 | Pagaila |
| 2011/0294244 A1 | 12/2011 | Hattori et al. |
| 2012/0003813 A1 | 1/2012 | Chuang et al. |
| 2012/0045871 A1 | 2/2012 | Lee et al. |
| 2012/0068276 A1 | 3/2012 | Lin et al. |
| 2012/0094418 A1 | 4/2012 | Grama et al. |
| 2012/0098074 A1 | 4/2012 | Lin et al. |
| 2012/0104495 A1 | 5/2012 | Zhu et al. |
| 2012/0119346 A1 | 5/2012 | Im et al. |
| 2012/0153393 A1 | 6/2012 | Liang et al. |
| 2012/0168863 A1 | 7/2012 | Zhu et al. |
| 2012/0256260 A1 | 10/2012 | Cheng et al. |
| 2012/0292700 A1 | 11/2012 | Khakifirooz et al. |
| 2012/0299105 A1 | 11/2012 | Cai et al. |
| 2013/0001665 A1 | 1/2013 | Zhu et al. |
| 2013/0015429 A1 | 1/2013 | Hong et al. |
| 2013/0049205 A1 | 2/2013 | Meyer et al. |
| 2013/0099315 A1 | 4/2013 | Zhu et al. |
| 2013/0105966 A1 | 5/2013 | Kelkar et al. |
| 2013/0147009 A1 | 6/2013 | Kim |
| 2013/0155681 A1 | 6/2013 | Nall et al. |
| 2013/0196483 A1 | 8/2013 | Dennard et al. |
| 2013/0200456 A1 | 8/2013 | Zhu et al. |
| 2013/0221493 A1 | 8/2013 | Kim et al. |
| 2013/0280826 A1 | 10/2013 | Scanlan et al. |
| 2013/0299871 A1 | 11/2013 | Mauder et al. |
| 2014/0015131 A1 | 1/2014 | Meyer et al. |
| 2014/0035129 A1 | 2/2014 | Stuber et al. |
| 2014/0134803 A1 | 5/2014 | Kelly et al. |
| 2014/0168014 A1 | 6/2014 | Chih et al. |
| 2014/0197530 A1 | 7/2014 | Meyer et al. |
| 2014/0210314 A1 | 7/2014 | Bhattacharjee et al. |
| 2014/0219604 A1 | 8/2014 | Hackler, Sr. et al. |
| 2014/0252566 A1 | 9/2014 | Kerr et al. |
| 2014/0252567 A1 | 9/2014 | Carroll et al. |
| 2014/0264813 A1 | 9/2014 | Lin et al. |
| 2014/0264818 A1 | 9/2014 | Lowe, Jr. et al. |
| 2014/0306324 A1 | 10/2014 | Costa et al. |
| 2014/0327003 A1 | 11/2014 | Fuergut et al. |
| 2014/0327150 A1 | 11/2014 | Jung et al. |
| 2014/0346573 A1 | 11/2014 | Adam et al. |
| 2014/0356602 A1 | 12/2014 | Oh et al. |
| 2015/0015321 A1 | 1/2015 | Dribinsky et al. |
| 2015/0108666 A1 | 4/2015 | Engelhardt et al. |
| 2015/0115416 A1 | 4/2015 | Costa et al. |
| 2015/0130045 A1 | 5/2015 | Tseng et al. |
| 2015/0136858 A1 | 5/2015 | Finn et al. |
| 2015/0197419 A1 | 7/2015 | Cheng et al. |
| 2015/0235990 A1 | 8/2015 | Cheng et al. |
| 2015/0235993 A1 | 8/2015 | Cheng et al. |
| 2015/0243881 A1 | 8/2015 | Sankman et al. |
| 2015/0255368 A1 | 9/2015 | Costa |
| 2015/0262844 A1 | 9/2015 | Meyer et al. |
| 2015/0279789 A1 | 10/2015 | Mahajan et al. |
| 2015/0311132 A1 | 10/2015 | Kuo et al. |
| 2015/0364344 A1 | 12/2015 | Yu et al. |
| 2015/0380394 A1 | 12/2015 | Jang et al. |
| 2015/0380523 A1 | 12/2015 | Hekmatshoartabari et al. |
| 2016/0002510 A1 | 1/2016 | Champagne et al. |
| 2016/0056544 A1 | 2/2016 | Garcia et al. |
| 2016/0079137 A1 | 3/2016 | Leipold et al. |
| 2016/0093580 A1 | 3/2016 | Scanlan et al. |
| 2016/0100489 A1 | 4/2016 | Costa et al. |
| 2016/0126111 A1 | 5/2016 | Leipold et al. |
| 2016/0126196 A1 | 5/2016 | Leipold et al. |
| 2016/0133591 A1 | 5/2016 | Hong et al. |
| 2016/0155706 A1 | 6/2016 | Yoneyama et al. |
| 2016/0284568 A1 | 9/2016 | Morris et al. |
| 2016/0284570 A1 | 9/2016 | Morris et al. |
| 2016/0343592 A1 | 11/2016 | Costa et al. |
| 2016/0343604 A1 | 11/2016 | Costa et al. |
| 2016/0347609 A1 | 12/2016 | Yu et al. |
| 2016/0362292 A1 | 12/2016 | Chang et al. |
| 2017/0024503 A1 | 1/2017 | Connelly |
| 2017/0032957 A1 | 2/2017 | Costa et al. |
| 2017/0033026 A1 | 2/2017 | Ho et al. |
| 2017/0053938 A1 | 2/2017 | Whitefield |
| 2017/0077028 A1 | 3/2017 | Maxim et al. |
| 2017/0098587 A1 | 4/2017 | Leipold et al. |
| 2017/0190572 A1 | 7/2017 | Pan et al. |
| 2017/0200648 A1 | 7/2017 | Lee et al. |
| 2017/0207350 A1 | 7/2017 | Leipold et al. |
| 2017/0263539 A1 | 9/2017 | Gowda et al. |
| 2017/0271200 A1 | 9/2017 | Costa |
| 2017/0323804 A1 | 11/2017 | Costa et al. |
| 2017/0323860 A1 | 11/2017 | Costa et al. |
| 2017/0334710 A1 | 11/2017 | Costa et al. |
| 2017/0358511 A1 | 12/2017 | Costa et al. |
| 2018/0019184 A1 | 1/2018 | Costa et al. |
| 2018/0019185 A1 | 1/2018 | Costa et al. |
| 2018/0044169 A1 | 2/2018 | Hatcher, Jr. et al. |
| 2018/0044177 A1 | 2/2018 | Vandemeer et al. |
| 2018/0047653 A1 | 2/2018 | Costa et al. |
| 2018/0269188 A1 | 9/2018 | Yu et al. |
| 2019/0043812 A1 | 2/2019 | Leobandung |
| 2019/0172842 A1 | 6/2019 | Whitefield |
| 2019/0189599 A1 | 6/2019 | Baloglu et al. |
| 2019/0287953 A1 | 9/2019 | Moon et al. |
| 2019/0304910 A1 | 10/2019 | Fillion |
| 2020/0058541 A1 | 2/2020 | Konishi et al. |

FOREIGN PATENT DOCUMENTS

| | | |
|---|---|---|
| CN | 103872012 A | 6/2014 |
| EP | 2996143 A1 | 3/2016 |
| JP | S505733 Y1 | 2/1975 |
| JP | H11220077 A | 8/1999 |
| JP | 200293957 A | 3/2002 |
| JP | 2002252376 A | 9/2002 |
| JP | 2006005025 A | 1/2006 |
| JP | 2007227439 A | 9/2007 |
| JP | 2008235490 A | 10/2008 |
| JP | 2008279567 A | 11/2008 |

(56) References Cited

FOREIGN PATENT DOCUMENTS

| JP | 2009026880 A | 2/2009 |
|---|---|---|
| JP | 2009530823 A | 8/2009 |
| JP | 2011243596 A | 12/2011 |
| WO | 2007074651 A1 | 7/2007 |
| WO | 2018083961 A1 | 5/2018 |
| WO | 2018125242 A1 | 7/2018 |

OTHER PUBLICATIONS

Notice of Allowance for U.S. Appl. No. 16/038,879, dated Jan. 9, 2019, 8 pages.
Non-Final Office Action for U.S. Appl. No. 15/945,418, dated Nov. 1, 2018, 13 pages.
Final Office Action for U.S. Appl. No. 15/601,858, dated Nov. 26, 2018, 16 pages.
Advisory Action for U.S. Appl. No. 15/601,858, dated Jan. 22, 2019, 3 pages.
Notice of Allowance for U.S. Appl. No. 16/004,961, dated Jan. 11, 2019, 8 pages.
Notice of Allowance for U.S. Appl. No. 16/004,961, dated May 13, 2019, 8 pages.
Final Office Action for U.S. Appl. No. 15/992,613, dated May 24, 2019, 11 pages.
Notice of Allowance for U.S. Appl. No. 15/992,639, dated May 9, 2019, 7 pages.
Non-Final Office Action for U.S. Appl. No. 15/873,152, dated May 24, 2019, 11 pages.
Notice of Allowance for U.S. Appl. No. 16/168,327, dated Jun. 28, 2019, 7 pages.
Non-Final Office Action for U.S. Appl. No. 15/601,858, dated Apr. 17, 2019, 9 pages.
Notice of Allowance for U.S. Appl. No. 15/387,855, dated Aug. 10, 2018, 7 pages.
Notice of Allowance and Applicant-Initiated Interview Summary for U.S. Appl. No. 15/262,457, dated Sep. 28, 2018, 16 pages.
Corrected Notice of Allowance for U.S. Appl. No. 15/676,693, dated Aug. 29, 2018, 5 pages.
Notice of Allowance for U.S. Appl. No. 15/914,538, dated Aug. 1, 2018, 9 pages.
Non-Final Office Action for U.S. Appl. No. 15/676,693, dated May 3, 2018, 14 pages.
Notice of Allowance for U.S. Appl. No. 15/789,107, dated May 18, 2018, 8 pages.
Final Office Action for U.S. Appl. No. 15/616,109, dated Apr. 19, 2018, 18 pages.
Notice of Allowance for U.S. Appl. No. 15/676,693, dated Jul. 20, 2018, 8 pages.
Notice of Allowance for U.S. Appl. No. 15/695,629, dated Jul. 11, 2018, 12 pages.
Non-Final Office Action for U.S. Appl. No. 15/695,579, dated Jan. 28, 2019, 8 pages.
Notice of Allowance for U.S. Appl. No. 15/695,579, dated Mar. 20, 2019, 8 pages.
Non-Final Office Action for U.S. Appl. No. 15/992,613, dated Feb. 27, 2019, 15 pages.
International Preliminary Report on Patentability for PCT/US2017/046744, dated Feb. 21, 2019, 11 pages.
International Preliminary Report on Patentability for PCT/US2017/046758, dated Feb. 21, 2019, 11 pages.
International Preliminary Report on Patentability for PCT/US2017/046779, dated Feb. 21, 2019, 11 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.
Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a9739076918c4297&ckck=1.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.
Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application=Substrates+%26+Electcronic_Packaging.
Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "CoolPoly Thermally Conductive Plastics for Substrates and Electronic Packaging," Cool Polymers, Inc., 2005, 1 page.
Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Fully Sintered Ferrite Powders," Powder Processing and Technology, LLC, Date Unknown, 1 page.
Author Unknown, "Heat Transfer," Cool Polymers, Inc., 2006, http://www.coolpolymers.com/heattrans.html, 2 pages.
Author Unknown, "Hysol UF3808," Henkel Corporation, Technical Data Sheet, May 2013, 2 pages.
Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid=89754e8bb26148d083c5ebb05a0cbff1.
Author Unknown, "Sapphire Substrate," from CRC Handbook of Chemistry and Physics, Date Unknown, 1 page.
Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.
Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.
Author Unknown, "The Technology: Akhan's Approach and Solution: The Miraj Diamond™ Platform," 2015, accessed Oct. 9, 2016, http://www.akhansemi.com/technology.html#the-miraj-diamond-platform, 5 pages.
Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.

(56) References Cited

OTHER PUBLICATIONS

Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.
Costa, J. et al., "Integrated MEMS Switch Technology On SOI-CMOS," Proceedings of Hilton Head Workshop: A Solid-State Sensors, Actuators and Microsystems Workshop, Jun. 1-5, 2008, Hilton Head Island, SC, IEEE, pp. 900-903.
Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R. M. et al., "A Water-Amine-Complexing Agent System for Etching Silicon," Journal of The Electrochemical Society, vol. 114, No. 9, Sep. 1967, pp. 965-970.
Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III-V materials and Si-CMOS through double layer transfer process," Japanese Journal of Applied Physics, vol. 54, Jan. 2015, pp. 030209-1 to 030209-5.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, YE.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
Mazuré, C. et al., "Advanced SOI Substrate Manufacturing," 2004 IEEE International Conference on Integrated circuit Design and Technology, 2004, IEEE, pp. 105-111.
Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Raskin, Jean-Pierre et al., "Substrate Crosstalk Reduction Using SOI Technology," IEEE Transactions on Electron Devices, vol. 44, No. 12, Dec. 1997, pp. 2252-2261.
Rong, B., et al., "Surface-Passivated High-Resistivity Silicon Substrates for RFICs," IEEE Electron Device Letters, vol. 25, No. 4, Apr. 2004, pp. 176-178.
Sherman, Lilli M., "Plastics that Conduct Heat," Plastics Technology Online, Jun. 2001, Retrieved May 17, 2016, http://www.ptonline.com/articles/plastics-that-conduct-heat, Gardner Business Media, Inc., 5 pages.
Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.
Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.
Non-Final Office Action for U.S. Appl. No. 13/852,648, dated Jul. 18, 2013, 20 pages.
Final Office Action for U.S. Appl. No. 13/852,648, dated Nov. 26, 2013, 21 pages.
Applicant-Initiated Interview Summary for U.S. Appl. No. 13/852,648, dated Jan. 27, 2014, 4 pages.
Advisory Action for U.S. Appl. No. 13/852,648, dated Mar. 7, 2014, 4 pages.
Notice of Allowance for U.S. Appl. No. 13/852,648, dated Jun. 16, 2014, 9 pages.
Notice of Allowance for U.S. Appl. No. 13/852,648, dated Sep. 26, 2014, 8 pages.
Notice of Allowance for U.S. Appl. No. 13/852,648, dated Jan. 22, 2015, 8 pages.
Non-Final Office Action for U.S. Appl. No. 13/852,648, dated Jun. 24, 2015, 20 pages.
Final Office Action for U.S. Appl. No. 13/852,648, dated Oct. 22, 2015, 20 pages.
Non-Final Office Action for U.S. Appl. No. 13/852,648, dated Feb. 19, 2016, 12 pages.
Final Office Action for U.S. Appl. No. 13/852,648, dated Jul. 20, 2016, 14 pages.
Non-Final Office Action for U.S. Appl. No. 14/315,765, dated Jan. 2, 2015, 6 pages.
Final Office Action for U.S. Appl. No. 14/315,765, dated May 11, 2015, 17 pages.
Advisory Action for U.S. Appl. No. 14/315,765, dated Jul. 22, 2015, 3 pages.
Non-Final Office Action for U.S. Appl. No. 14/260,909, dated Mar. 20, 2015, 20 pages.
Final Office Action for U.S. Appl. No. 14/260,909, dated Aug. 12, 2015, 18 pages.
Non-Final Office Action for U.S. Appl. No. 14/261,029, dated Dec. 5, 2014, 15 pages.
Notice of Allowance for U.S. Appl. No. 14/261,029, dated Apr. 27, 2015, 10 pages.
Corrected Notice of Allowability for U.S. Appl. No. 14/261,029, dated Nov. 17, 2015, 5 pages.
Non-Final Office Action for U.S. Appl. No. 14/529,870, dated Feb. 12, 2016, 14 pages.
Notice of Allowance for U.S. Appl. No. 14/529,870, dated Jul. 15, 2016, 8 pages.

(56) References Cited

OTHER PUBLICATIONS

Non-Final Office Action for U.S. Appl. No. 15/293,947, dated Apr. 7, 2017, 12 pages.
Notice of Allowance for U.S. Appl. No. 15/293,947, dated Aug. 14, 2017, 7 pages.
Non-Final Office Action for U.S. Appl. No. 14/715,830, dated Apr. 13, 2016, 16 pages.
Final Office Action for U.S. Appl. No. 14/715,830, dated Sep. 6, 2016, 13 pages.
Advisory Action for U.S. Appl. No. 14/715,830, dated Oct. 31, 2016, 6 pages.
Notice of Allowance for U.S. Appl. No. 14/715,830, dated Feb. 10, 2017, 8 pages.
Notice of Allowance for U.S. Appl. No. 14/715,830, dated Mar. 2, 2017, 8 pages.
Non-Final Office Action for U.S. Appl. No. 14/851,652, dated Oct. 7, 2016, 10 pages.
Notice of Allowance for U.S. Appl. No. 14/851,652, dated Apr. 11, 2017, 9 pages.
Corrected Notice of Allowance for U.S. Appl. No. 14/851,652, dated Jul. 24, 2017, 6 pages.
Corrected Notice of Allowance for U.S. Appl. No. 14/851,652, dated Sep. 6, 2017, 5 pages.
Notice of Allowance for U.S. Appl. No. 14/959,129, dated Oct. 11, 2016, 8 pages.
Non-Final Office Action for U.S. Appl. No. 15/173,037, dated Jan. 10, 2017, 8 pages.
Final Office Action for U.S. Appl. No. 15/173,037, dated May 2, 2017, 13 pages.
Advisory Action for U.S. Appl. No. 15/173,037, dated Jul. 20, 2017, 3 pages.
Notice of Allowance for U.S. Appl. No. 15/173,037, dated Aug. 9, 2017, 7 pages.
Non-Final Office Action for U.S. Appl. No. 15/085,185, dated Feb. 15, 2017, 10 pages.
Non-Final Office Action for U.S. Appl. No. 15/085,185, dated Jun. 6, 2017, 5 pages.
Non-Final Office Action for U.S. Appl. No. 15/229,780, dated Jun. 30, 2017, 12 pages.
Non-Final Office Action for U.S. Appl. No. 15/262,457, dated Aug. 7, 2017, 10 pages.
Notice of Allowance for U.S. Appl. No. 15/408,560, dated Sep. 25, 2017, 8 pages.
Notice of Allowance for U.S. Appl. No. 15/287,202, dated Aug. 25, 2017, 11 pages.
Non-Final Office Action for U.S. Appl. No. 15/353,346, dated May 23, 2017, 15 pages.
Notice of Allowance for U.S. Appl. No. 15/353,346, dated Sep. 25, 2017, 9 pages.
Notice of Allowance for U.S. Appl. No. 15/287,273, dated Jun. 30, 2017, 8 pages.
Corrected Notice of Allowability for U.S. Appl. No. 15/287,273, dated Jul. 21, 2017, 5 pages.
Supplemental Notice of Allowability for U.S. Appl. No. 15/287,273, dated Sep. 7, 2017, 5 pages.
Extended European Search Report for European Patent Application No. 15184861.1, dated Jan. 25, 2016, 6 pages.
Office Action of the Intellectual Property Office for Taiwanese Patent Application No. 104130224, dated Jun. 15, 2016, 9 pages.
Non-Final Office Action for U.S. Appl. No. 14/885,202, dated Apr. 14, 2016, 5 pages.
Final Office Action for U.S. Appl. No. 14/885,202, dated Sep. 27, 2016, 7 pages.
Advisory Action for U.S. Appl. No. 14/885,202, dated Nov. 29, 2016, 3 pages.
Notice of Allowance for U.S. Appl. No. 14/885,202, dated Jan. 27, 2017, 7 pages.
Notice of Allowance for U.S. Appl. No. 14/885,202, dated Jul. 24, 2017, 8 pages.
Notice of Allowance for U.S. Appl. No. 14/885,243, dated Aug. 31, 2016, 8 pages.
Non-Final Office Action for U.S. Appl. No. 12/906,689, dated May 27, 2011, 13 pages.
Non-Final Office Action for U.S. Appl. No. 12/906,689, dated Nov. 4, 2011, 20 pages.
Search Report for Japanese Patent Application No. 2011-229152, created on Feb. 22, 2013, 58 pages.
Office Action for Japanese Patent Application No. 2011-229152, drafted May 10, 2013, 7 pages.
Final Rejection for Japanese Patent Application No. 2011-229152, drafted Oct. 25, 2013, 2 pages.
International Search Report and Written Opinion for PCT/US2016/045809, dated Oct. 7, 2016, 11 pages.
Non-Final Office Action for U.S. Appl. No. 15/652,867, dated Oct. 10, 2017, 5 pages.
Bernheim et al., "Chapter 9: Lamination," Tools and Manufacturing Engineers Handbook (book), Apr. 1, 1996, Society of Manufacturing Engineers, p. 9-1.
Fillion R. et al., "Development of a Plastic Encapsulated Multichip Technology for High Volume, Low Cost Commercial Electronics," Electronic Components and Technology Conference, vol. 1, May 1994, IEEE, 5 pages.
Henawy, Mahmoud Al et al., "New Thermoplastic Polymer Substrate for Microstrip Antennas at 60 GHz," German Microwave Conference, Mar. 15-17, 2010, Berlin, Germany, IEEE, pp. 5-8.
International Search Report and Written Opinion for PCT/US2017/046744, dated Nov. 27, 2017, 17 pages.
International Search Report and Written Opinion for PCT/US2017/046758, dated Nov. 16, 2017, 19 pages.
International Search Report and Written Opinion for PCT/US2017/046779, dated Nov. 29, 2017, 17 pages.
Non-Final Office Action for U.S. Appl. No. 15/616,109, dated Oct. 23, 2017, 16 pages.
Corrected Notice of Allowability for U.S. Appl. No. 14/851,652, dated Oct. 20, 2017, 5 pages.
Final Office Action for U.S. Appl. No. 15/262,457, dated Dec. 19, 2017, 12 pages.
Supplemental Notice of Allowability and Applicant-Initiated Interview Summary for U.S. Appl. No. 15/287,273, dated Oct. 18, 2017, 6 pages.
Supplemental Notice of Allowability for U.S. Appl. No. 15/287,273, dated Nov. 2, 2017, 5 pages.
Non-Final Office Action for U.S. Appl. No. 15/491,064, dated Jan. 2, 2018, 9 pages.
Notice of Allowance for U.S. Appl. No. 14/872,910, dated Nov. 17, 2017, 11 pages.
Notice of Allowance for U.S. Appl. No. 15/648,082, dated Nov. 29, 2017, 8 pages.
Non-Final Office Action for U.S. Appl. No. 15/652,826, dated Nov. 3, 2017, 5 pages.
Notice of Allowance for U.S. Appl. No. 15/229,780, dated Oct. 3, 2017, 7 pages.
Supplemental Notice of Allowability for U.S. Appl. No. 15/287,273, dated Jan. 17, 2018, 5 pages.
Notice of Allowance for U.S. Appl. No. 15/498,040, dated Feb. 20, 2018, 8 pages.
Non-Final Office Action for U.S. Appl. No. 15/387,855, dated Jan. 16, 2018, 7 pages.
Non-Final Office Action for U.S. Appl. No. 15/795,915, dated Feb. 23, 2018, 6 pages.
International Preliminary Report on Patentability for PCT/US2016/045809, dated Feb. 22, 2018, 8 pages.
Advisory Action and Applicant-Initiated Interview Summary for U.S. Appl. No. 15/262,457, dated Feb. 28, 2018, 5 pages.
Supplemental Notice of Allowability for U.S. Appl. No. 15/287,273, dated Feb. 23, 2018, 5 pages.
Non-Final Office Action for U.S. Appl. No. 15/676,415, dated Mar. 27, 2018, 14 page.
Non-Final Office Action for U.S. Appl. No. 15/676,621, dated Mar. 26, 2018, 16 pages.
Notice of Allowance for U.S. Appl. No. 15/795,915, dated Jun. 15, 2018, 7 pages.

(56) References Cited

OTHER PUBLICATIONS

Final Office Action for U.S. Appl. No. 15/387,855, dated May 24, 2018, 9 pages.
Non-Final Office Action for U.S. Appl. No. 15/262,457, dated Apr. 19, 2018, 10 pages.
Notice of Allowance for U.S. Appl. No. 15/491,064, dated Apr. 30, 2018, 9 pages.
Non-Final Office Action for U.S. Appl. No. 15/601,858, dated Jun. 26, 2018, 12 pages.
Notice of Allowance for U.S. Appl. No. 15/616,109, dated Jul. 2, 2018, 7 pages.
Notice of Allowance for U.S. Appl. No. 15/676,621, dated Jun. 5, 2018, 8 pages.
Notice of Allowance for U.S. Appl. No. 16/004,961, dated Aug. 28, 2019, 8 pages.
Notice of Allowance for U.S. Appl. No. 15/601,858, dated Aug. 16, 2019, 8 pages.
Advisory Action for U.S. Appl. No. 15/992,613, dated Jul. 29, 2019, 3 pages.
Final Office Action for U.S. Appl. No. 15/873,152, dated Aug. 8, 2019, 13 pages.
International Search Report and Written Opinion for International Patent Application No. PCT/US19/25591, dated Jun. 21, 2019, 7 pages.
Notice of Reasons for Refusal for Japanese Patent Application No. 2015-180657, dated Jul. 9, 2019, 4 pages.
International Search Report and Written Opinion for International Patent Application No. PCT/US2019/034645, dated Sep. 19, 2019, 14 pages.
International Search Report and Written Opinion for International Patent Application No. PCT/US2019/034699, dated Oct. 29, 2019, 13 pages.
Notice of Allowance for U.S. Appl. No. 15/992,613, dated Sep. 23, 2019, 7 pages.
Non-Final Office Action for U.S. Appl. No. 16/204,214, dated Oct. 9, 2019, 15 pages.
Non-Final Office Action for U.S. Appl. No. 15/816,637, dated Oct. 31, 2019, 10 pages.
Advisory Action for U.S. Appl. No. 15/873,152, dated Oct. 11, 2019, 3 pages.
Office Action for Japanese Patent Application No. 2018-526613, dated Nov. 5, 2019, 8 pages.
Non-Final Office Action for U.S. Appl. No. 16/527,702, dated Jan. 10, 2020, 10 pages.
Notice of Allowance for U.S. Appl. No. 15/873,152, dated Dec. 10, 2019, 9 pages.
Intention to Grant for European Patent Application No. 17757646.9, dated Feb. 27, 2020, 55 pages.
International Search Report and Written Opinion for International Patent Application No. PCT/US2019/063460, dated Feb. 25, 2020, 14 pages.
International Search Report and Written Opinion for International Patent Application No. PCT/US2019/055317, dated Feb. 6, 2020, 17 pages.
International Search Report and Written Opinion for International Patent Application No. PCT/US2019/055321, dated Jan. 27, 2020, 23 pages.
Corrected Notice of Allowability for U.S. Appl. No. 15/695,579, dated Feb. 5, 2020, 5 pages.
Final Office Action for U.S. Appl. No. 16/204,214, dated Mar. 6, 2020, 14 pages.
Decision of Rejection for Japanese Patent Application No. 2015-180657, dated Mar. 17, 2020, 4 pages.
Examination Report for European Patent Application No. 16751791.1, dated Apr. 30, 2020, 15 pages.
Notification of Reasons for Refusal for Japanese Patent Application No. 2018-526613, dated May 11, 2020, 5 pages.
Notice of Allowance for U.S. Appl. No. 16/038,879, dated Apr. 15, 2020, 9 pages.
Notice of Allowance for U.S. Appl. No. 15/816,637, dated Apr. 2, 2020, 8 pages.
Notice of Allowance for U.S. Appl. No. 15/873,152, dated May 11, 2020, 8 pages.
Corrected Notice of Allowability for U.S. Appl. No. 15/695,579, dated Apr. 1, 2020, 4 pages.
Notice of Allowance for U.S. Appl. No. 16/004,961, dated Apr. 30, 2020, 8 pages.
Notice of Allowance for U.S. Appl. No. 16/527,702, dated Apr. 9, 2020, 8 pages.
Advisory Action for U.S. Appl. No. 16/204,214, dated Apr. 15, 2020, 3 pages.
Notice of Allowance for U.S. Appl. No. 16/454,687, dated May 15, 2020, 14 pages.
Quayle Action for U.S. Appl. No. 16/703,251, dated Jun. 26, 2020, 5 pages.
Corrected Notice of Allowability for U.S. Appl. No. 15/695,579, dated May 20, 2020, 4 pages.
Notice of Allowance for U.S. Appl. No. 16/368,210, dated Jun. 17, 2020, 10 pages.
Non-Final Office Action for U.S. Appl. No. 16/374,125, dated Jun. 26, 2020, 12 pages.
Non-Final Office Action for U.S. Appl. No. 16/204,214, dated May 19, 2020, 15 pages.
Non-Final Office Action for U.S. Appl. No. 16/454,809, dated May 15, 2020, 12 pages.
Welser, J. et al., "Electron Mobility Enhancement in Strained-Si N-Type Metal-Oxide Semiconductor Field-Effect Transistors," IEEE Electron Device Letters, vol. 15, No. 3, Mar. 1994, IEEE, pp. 100-102.
Examination Report for Singapore Patent Application No. 11201901193U, dated May 26, 2020, 6 pages.
International Search Report and Written Opinion for International Patent Application No. PCT/US2020/014665, dated May 13, 2020, 17 pages.
International Search Report and Written Opinion for International Patent Application No. PCT/US2020/014666, dated Jun. 4, 2020, 18 pages.
International Search Report and Written Opinion for International Patent Application No. PCT/US2020/014667, dated May 18, 2020, 14 pages.
International Search Report and Written Opinion for International Patent Application No. PCT/US2020/014669, dated Jun. 4, 2020, 15 pages.
Zeng, X. et al., "A Combination of Boron Nitride Nanotubes and Cellulose Nanofibersfor the Preparation of A Nanocomposite with High Thermal Conductivity." ACS Nano, vol. 11, No. 5, 2017, American Chemical Society, pp. 5167-5178.
Notice of Allowability for U.S. Appl. No. 15/695,579, dated Jun. 25, 2020, 4 pages.
Non-Final Office Action for U.S. Appl. No. 16/390,496, dated Jul. 10, 2020, 17 pages.
International Search Report and Written Opinion for International Patent Application No. PCT/US2020/014662, dated May 7, 2020, 18 pages.
Notice of Allowance for U.S. Appl. No. 16/703,251, dated Aug. 27, 2020, 8 pages.
Notice of Allowance for U.S. Appl. No. 16/454,687, dated Aug. 14, 2020, 7 pages.
Final Office Action for U.S. Appl. No. 16/454,809, dated Aug. 21, 2020, 12 pages.
Decision to Grant for Japanese Patent Application No. 2018-526613, dated Aug. 17, 2020, 5 pages.
Notice of Allowance for U.S. Appl. No. 16/527,702, dated Nov. 13, 2020, 8 pages.
Notice of Allowance for U.S. Appl. No. 16/374,125, dated Dec. 16, 2020, 9 pages.
Final Office Action for U.S. Appl. No. 16/390,496, dated Dec. 24, 2020, 21 pages.
Notice of Allowance for U.S. Appl. No. 16/426,527, dated Nov. 20, 2020, 7 pages.
Final Office Action for U.S. Appl. No. 16/204,214, dated Nov. 30, 2020, 15 pages.

(56) References Cited

OTHER PUBLICATIONS

Advisory Action for U.S. Appl. No. 16/454,809, dated Oct. 23, 2020, 3 pages.
Notice of Allowance for U.S. Appl. No. 16/454,809, dated Nov. 25, 2020, 8 pages.
Non-Final Office Action for U.S. Appl. No. 16/427,019, dated Nov. 19, 2020, 19 pages.
International Preliminary Report on Patentability for International Patent Application No. PCT/US2019/025591, dated Oct. 15, 2020, 6 pages.
Advisory Action for U.S. Appl. No. 16/390,496, dated Mar. 1, 2021, 3 pages.
Notice of Allowance for U.S. Appl. No. 16/204,214, dated Feb. 17, 2021, 11 pages.
Non-Final Office Action for U.S. Appl. No. 16/678,573, dated Feb. 19, 2021, 11 pages.
Non-Final Office Action for U.S. Appl. No. 16/678,602, dated Feb. 19, 2021, 10 pages.
First Office Action for Chinese Patent Application No. 201680058198.6, dated Dec. 29, 2021, 14 pages.
International Preliminary Report on Patentability for International Patent Application No. PCT/US2019/034645, dated Jan. 14, 2021, 9 pages.

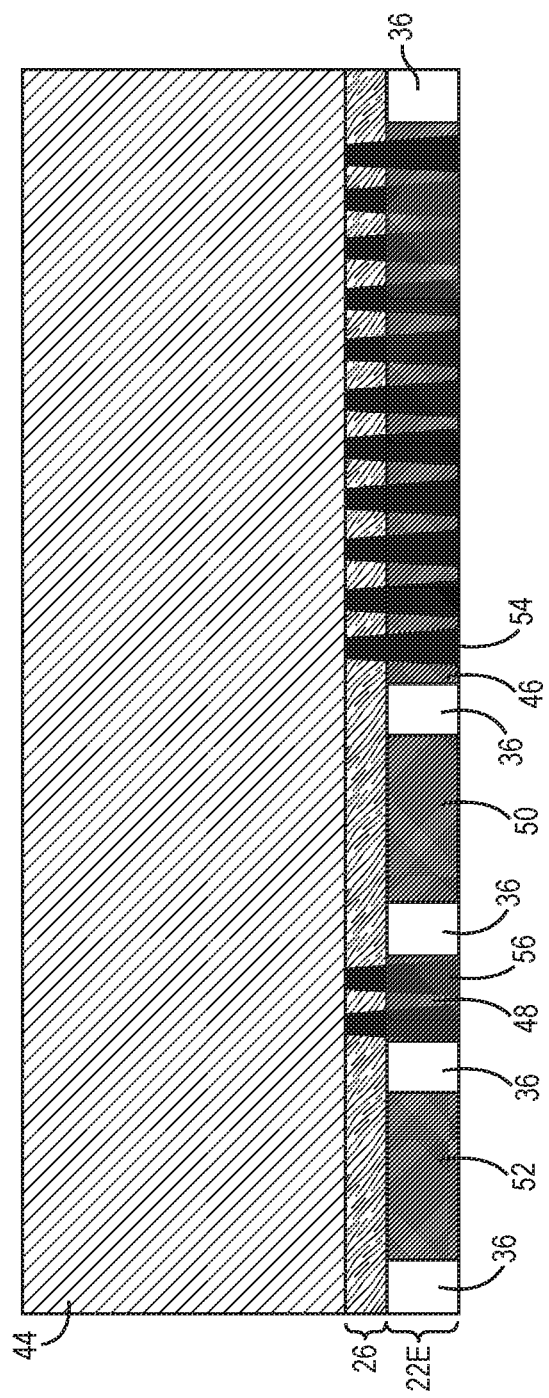

SEMICONDUCTOR PACKAGE WITH REDUCED PARASITIC COUPLING EFFECTS AND PROCESS FOR MAKING THE SAME

RELATED APPLICATIONS

This application is a divisional of U.S. patent application Ser. No. 15/498,040, filed Apr. 26, 2017, now U.S. Pat. No. 10,109,502, which claims the benefit of provisional patent application Ser. No. 62/393,201, filed Sep. 12, 2016, the disclosures of which are hereby incorporated herein by reference in their entirety.

FIELD OF THE DISCLOSURE

The present disclosure relates to a semiconductor package and a process for making the same, and more particularly to a semiconductor package with reduced parasitic coupling effects, and a process for reducing parasitic coupling effects between devices within the semiconductor package.

BACKGROUND

Silicon-on-insulator (SOI) structures are widely used to form semiconductor packages due to the low cost of silicon materials, large scale capacity of wafer production, well-established semiconductor design tools, and well-established semiconductor manufacturing techniques. Within a conventional semiconductor package formed from SOI structure, parasitic coupling effects between devices (active or passive) are dominated by the parasitic coupling through the silicon handle layer of the SOI structure. The fact that the silicon's dielectric constant is much higher than the oxide's dielectric constant makes most field lines close through the silicon handle layer.

For the modern communication applications, a high degree of isolation between signal paths is highly desired. This in turn requires a low degree of parasitic coupling between devices. Other design constraints such as low insertion loss and high voltage swings result in large size devices. Such large size devices have large parasitic bottom capacitances that lead to poor isolation from other large size devices placed in close proximity.

Accordingly, there remains a need for improved semiconductor package designs with SOI structures to reduce parasitic coupling effects between devices within the semiconductor package. In addition, there is also a need to keep the size and cost of the final semiconductor package effective.

SUMMARY

The present disclosure relates to a semiconductor package with reduced parasitic coupling effects, and a process for making the same. According to one embodiment, a semiconductor package includes a thinned flip-chip die and a first mold compound component with a low dielectric constant no more than 7. The thinned flip-chip die includes a back-end-of-line (BEOL) layer with an upper surface that includes a first surface portion and a second surface portion surrounding the first surface portion, a device layer over the upper surface of the BEOL layer, and a buried oxide (BOX) layer over the device layer. The BEOL layer includes a first passive device and a second passive device, which are underlying the first surface portion and not underlying the second surface portion. Herein, the first mold compound component extends through the BOX layer and the device layer to the first surface portion.

In one embodiment of the semiconductor package, a portion of the first mold compound component extends over at least a portion of the BOX layer.

In one embodiment of the semiconductor package, the first mold compound component resides over an entirety of the thinned flip-chip die.

According to another embodiment, the semiconductor package further includes a thermally enhanced mold compound component that resides over the first mold compound component.

According to another embodiment, the semiconductor package further includes a module substrate and a second mold compound component. Herein, the thinned flip-chip die further includes a number of interconnects that extend from a lower surface of the BEOL layer and are coupled to an upper surface of the module substrate. The second mold compound component resides over the upper surface of the module substrate and encapsulates at least sides of the first mold compound component and the thinned flip-chip die.

In one embodiment of the semiconductor package, the device layer comprises a first active device and an isolation region. Herein, the first active device and the isolation region are over the second surface portion and not over the first surface portion, and the isolation region surrounds the first active device and separates the first active device from the first mold compound component.

In one embodiment of the semiconductor package, the BOX layer is over the first active device and the isolation region. The first mold compound component extends over at least a portion of the BOX layer, which is over the first active device.

In one embodiment of the semiconductor package, the upper surface of the BEOL layer further includes a third surface portion that is surrounded by the second surface portion and separated from the first surface portion. The device layer further includes a second active device. Herein, the second active device is over the second surface portion, not over the first surface portion or the third surface portion. The isolation region surrounds the second active device and separates the second active device from the first mold compound component. The first mold compound component extends through the BOX layer and the device layer to the third surface portion and separates the first active device and the second active device.

In one embodiment of the semiconductor package, the BOX layer is over the first active device, the second active device, and the isolation region. The first mold compound component extends over at least a portion of the BOX layer, which is over the first active device and the second active device.

According to another embodiment, a semiconductor package includes a thinned flip-chip die and a first mold compound component with a low dielectric constant no more than 7. The thinned flip-chip die includes a BEOL layer with an upper surface that includes a first surface portion and a second surface portion surrounding the first surface portion, a device layer over the upper surface of the BEOL layer, and a BOX layer over the device layer. The device layer includes a first active device and a second active device, which are over the second surface portion and not over the first surface portion. Herein, the first mold compound component extends through the BOX layer and the device layer to the first surface portion so as to separate the first active device and the second active device. The first mold compound component also extends over at least a portion of the BOX layer, which is over the first active device and the second active device.

According to another embodiment, a semiconductor package includes a thinned flip-chip die and a first mold compound component with a low dielectric constant no more than 7. The thinned flip-chip die includes a BEOL layer with an upper surface that includes a first surface portion and a second surface portion surrounding the first surface portion, a device layer over the upper surface of the BEOL layer, and a BOX layer over the device layer. The BEOL layer includes a first passive device, which is underlying the first surface portion and not underlying the second surface portion. The device layer includes a first active device, which is over the second surface portion and not over the first surface portion. Herein, the first mold compound component extends through the BOX layer and the device layer to the first surface portion. The first mold compound component also extends over at least a portion of the BOX layer, which is over the first active device.

According to an exemplary process, a silicon-on-insulator (SOI) structure including an epitaxial layer, a BOX layer over the epitaxial layer, and a silicon handle layer over the BOX layer is provided. The epitaxial layer has at least one sacrificial epitaxial section. Next, at least one etchable structure that extends through the at least one sacrificial epitaxial section and the BOX layer to the silicon handle layer is formed. A BEOL layer is then formed underlying the epitaxial layer. Herein, the BEOL layer has an upper surface that includes a first surface portion and a second surface portion surrounding the first surface portion. The at least one sacrificial epitaxial section is over the first surface portion and not over the second surface portion. The BEOL layer includes a first passive device and a second passive device, which are underlying the first surface portion and not underlying the second surface portion.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1A:
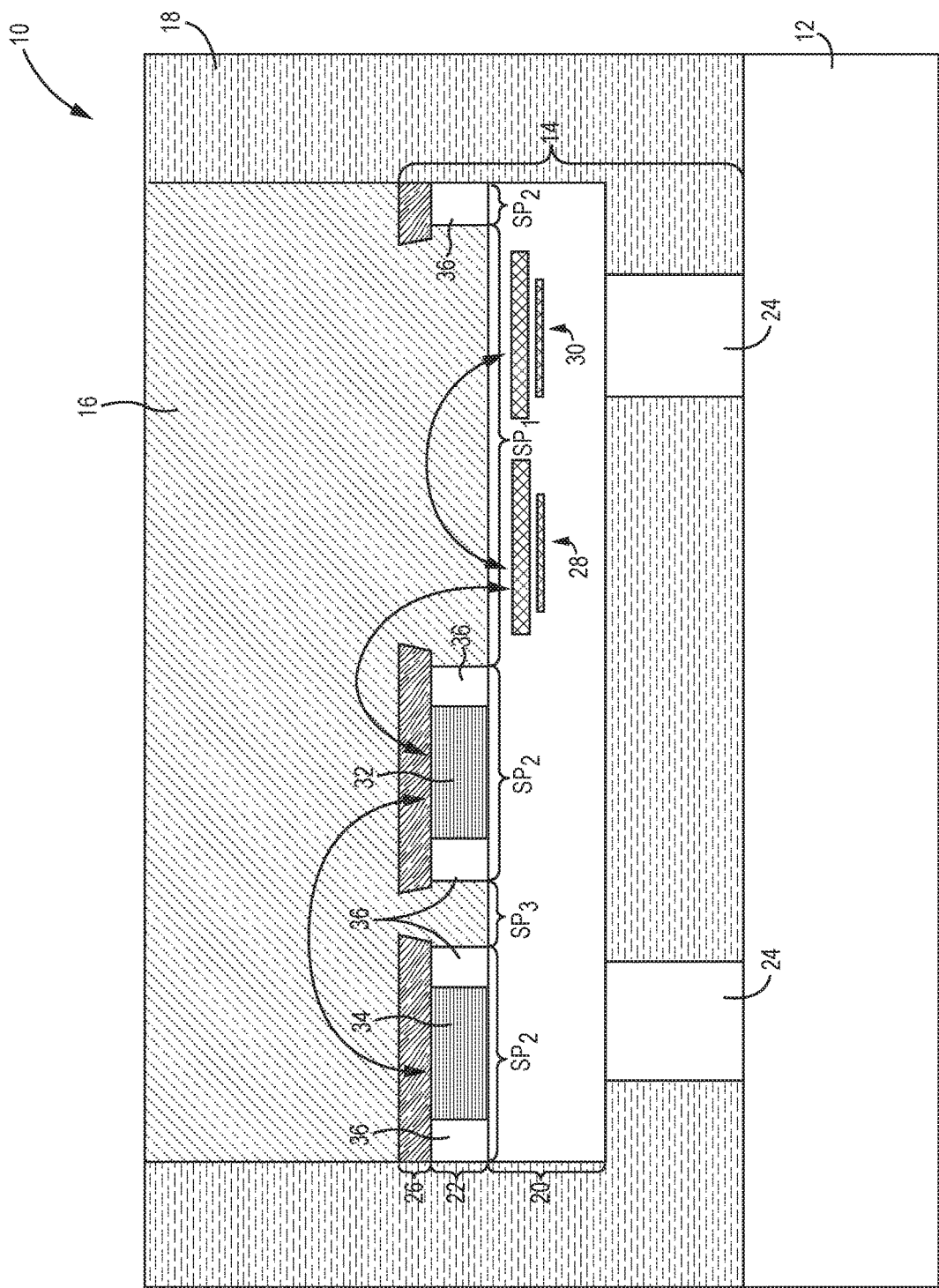
FIG. 1A and FIG. 1B show an exemplary semiconductor package according to one embodiment of the present disclosure.

FIGS. 4-15 provide exemplary steps that illustrate a process to fabricate exemplary semiconductor package shown in FIG. 1A.

It will be understood that for clear illustrations, FIGS. 1A-15 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1B:
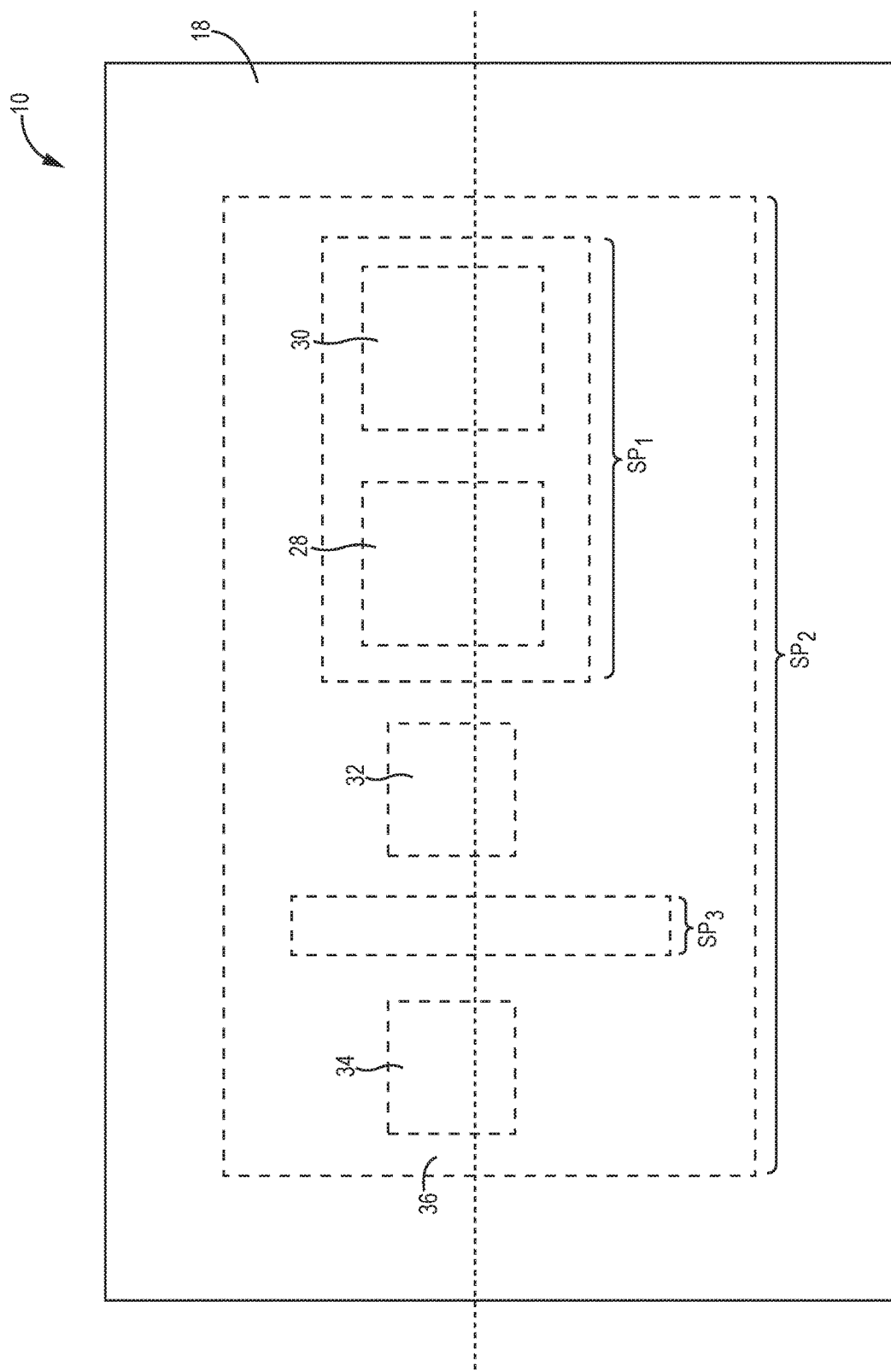

The present disclosure relates to a semiconductor package with reduced parasitic coupling effects, and a process for making the same. FIGS. 1A and 1B provide an exemplary semiconductor package 10 according to one embodiment of the present disclosure. FIG. 1A shows a cross-sectional view of the exemplary semiconductor package 10, and FIG. 1B shows a top view of the exemplary semiconductor package 10. For the purpose of this illustration, the semiconductor package 10 includes a module substrate 12, a thinned flip-chip die 14, a first mold compound component 16, and a second mold compound component 18. In different applications, the semiconductor package 10 may include multiple thinned flip-chip dies.

In detail, the module substrate 12 may be formed from a laminate, a wafer level fan out (WLFO) carrier, a lead frame, a ceramic carrier, or the like. The thinned flip-chip die 14 includes a back-end-of-line (BEOL) layer 20, a device layer 22 over an upper surface of the BEOL layer 20, a number of interconnects 24 extending from a lower surface of the BEOL layer 20 and coupled to an upper surface of the module substrate 12, and a buried oxide (BOX) layer 26 over the device layer 22. Herein, the upper surface of the BEOL layer 20 includes a first surface portion SP1, a second surface portion SP2, and a third surface portion SP3. The second surface portion SP2 surrounds the first surface portion SP1 and the third surface portion SP3, and the second surface portion SP2 separates the first surface portion SP1 from the third surface portion SP3.

There are a first passive device 28 and a second passive device 30 embedded in the BEOL layer 20. Both the first passive device 28 and the second passive device 30 are underlying the first surface portion SP1 and not underlying the second surface portion SP2. The device layer 22 includes a first active device 32, a second active device 34, and an isolation region 36. The first active device 32, the second active device 34, and the isolation region 36 are over the second surface portion SP2 and not over the first surface portion SP1 or the third surface portion SP3. The BOX layer 26 is over the first active device 32, the second active device 34, and the isolation region 36. In addition, the first active device 32 and the second active device 34 are located on opposite sides of the third surface portion SP3, and the first active device 32 is close to the first passive device 28. Both the first active device 32 and the second active device 34 are surrounded by the isolation region 36. The isolation region 36 may be formed by shallow trench isolation (STI). In different applications, the BEOL layer 20 may include fewer or more passive devices, the device layer 22 may include fewer or more active devices, and the configuration of the passive devices and active devices may be different. The first passive device 28 and the second passive device 30 may be metal-insulator-metal (MIM) capacitors. The first active device 32 and the second active device 34 may be field effect transistors (FET).

The first mold compound component 16 extends through the BOX layer 26 and the device layer 22 to the first surface portion SP1 and the third surface portion SP3. A portion of the first mold compound component 16 extends over at least a portion of the BOX layer 26, which is over the first active device 32 and the second active device 34. In some applications, the first mold compound component 16 resides over an entirety of the thinned flip-chip die 14. Consequently, the first mold compound component 16 resides over the first passive device 28 and the second passive device 30. Also, the first mold compound component 16 separates the first active device 32 and the second active device 34, and resides over the first active device 32 and the second active device 34. Further, the first mold compound component 16 is separated from the first active device 32 and the second active device 34 by the isolation region 36. The first mold compound component 16 may be formed from low dielectric constant materials with the dielectric constant being no more than 7 or no more than 4, such as organic thermoset and thermoplastic polymer materials, and the like.

Because the first mold compound component 16 is adjacent to the first passive device 28 and the second passive device 30, and has a dielectric constant no more than 7, a parasitic coupling effect between the first passive device 28 and the second passive device 30 is low. Most parasitic field lines between the first passive device 28 and the second passive device 30 (shown as a double arrow) close through the first mold compound component 16. Similarly, because the first mold compound component 16 is adjacent to the first active device 32 and the second active device 34 and inserted between the first active device 32 and the second active device 34, a parasitic coupling effect between the first active device 32 and the second active device 34 is low. Most parasitic field lines between the first active device 32 and the second active device 34 (shown as a double arrow) close through the first mold compound component 16. Further, a parasitic coupling effect between the first passive device 28 and the first active device 32 is low, due to the first mold compound component 16 adjacent to the first passive device 28 and the first active device 32. Most parasitic field lines between the first passive device 28 and the first active device 32 (shown as a double arrow) close through the first mold compound component 16.

The second mold compound component 18 resides over the upper surface of the module substrate 12 and encapsulates at least the sides of the first mold compound component 16 and the thinned flip-chip die 14. In some applications, a portion of the first mold compound component 16 may reside over an upper surface of the second mold compound component 18 (not shown). Herein, the second mold compound component 18 may be formed from the same or different material as the first mold compound component 16. However, unlike the first mold compound component 16, the second mold compound component 18 does not have a dielectric constant requirement in low parasitic coupling embodiments. One exemplary material used to form the second mold compound component 18 is an organic epoxy resin system.

Figure 2:
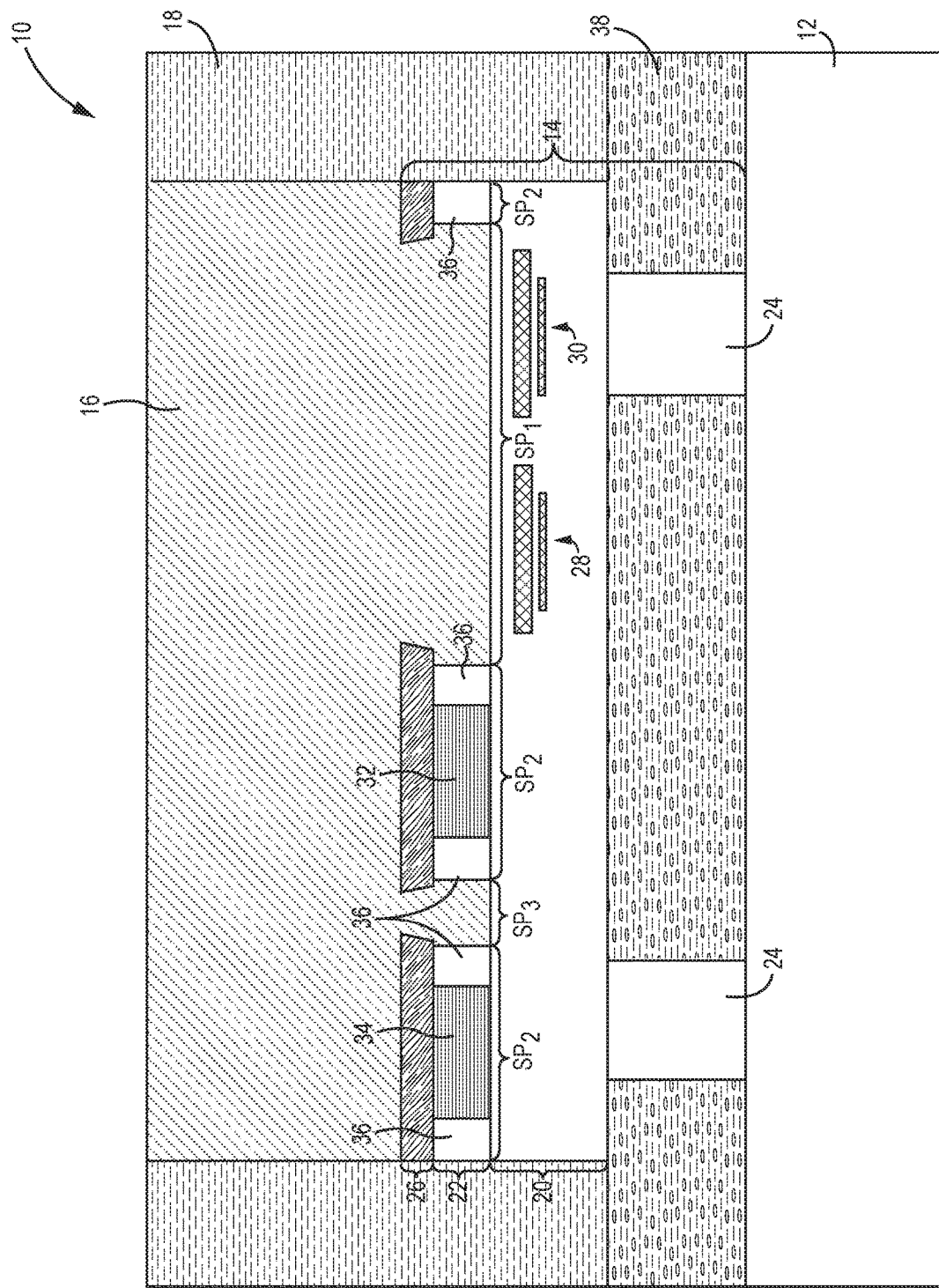
FIG. 2 shows an alternative semiconductor package according to one embodiment of the present disclosure.

In some applications, the semiconductor package 10 may further include an underfilling layer 38, as shown in FIG. 2. The underfilling layer 38 resides between the upper surface of the module substrate 12 and the second mold compound component 18, such that the underfilling layer 38 encapsulates the interconnects 24 and underfills the thinned flip-chip die 14 between the lower surface of the BEOL layer 20 and the upper surface of the module substrate 12. Herein, the second mold compound component 18 resides over the underfilling layer 38, and encapsulates at least the sides of the first mold compound component 16, the sides of the BOX layer 26, the sides of the device layer 22, and the sides of the BEOL layer 20. The underfilling layer 38 may be formed from the same or different material as the second mold compound component 18.

Figure 3:
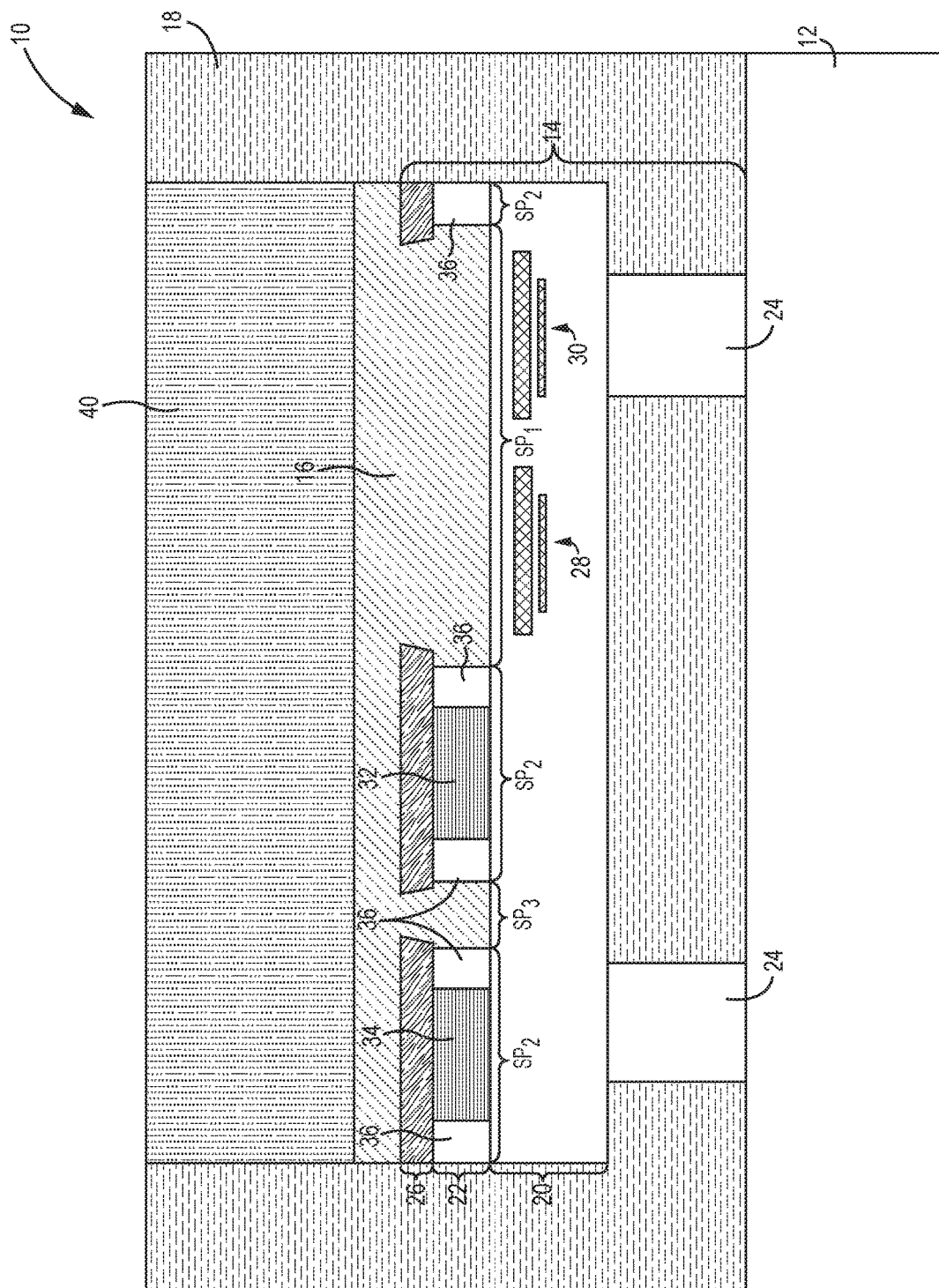
FIG. 3 shows an alternative semiconductor package according to one embodiment of the present disclosure.

In another embodiment, as shown in FIG. 3, the semiconductor package 10 may further include a thermally enhanced mold compound component 40 that resides over the first mold compound component 16. Herein, the second mold compound component 18 further encapsulates at least the sides of the thermally enhanced mold compound component 40. In some applications, a portion of the thermally enhanced mold compound component 40 may reside over an upper surface of the second mold compound component 18 (not shown). The thermally enhanced mold compound component 40 may be formed from a thermoset or thermoplastic material. Compared to a normal mold compound component having 1 w/m·k thermal conductivity, a thermally enhanced mold compound component may have 2.5 w/m·k~50 w/m·k or greater thermal conductivity. The higher the thermal conductivity, the better the heat dissipation performance of the semiconductor package 10. The thermally enhanced mold compound component 40 may be formed from the same or different material as the first mold compound component 16. However, unlike the first mold compound component 16, the thermally enhanced mold compound component 40 does not have a dielectric constant requirement in low parasitic coupling embodiments.

FIGS. 4-15 provide exemplary steps that illustrate a process to fabricate exemplary semiconductor package 10 shown in FIG. 1A. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 4-15.

Figure 4:
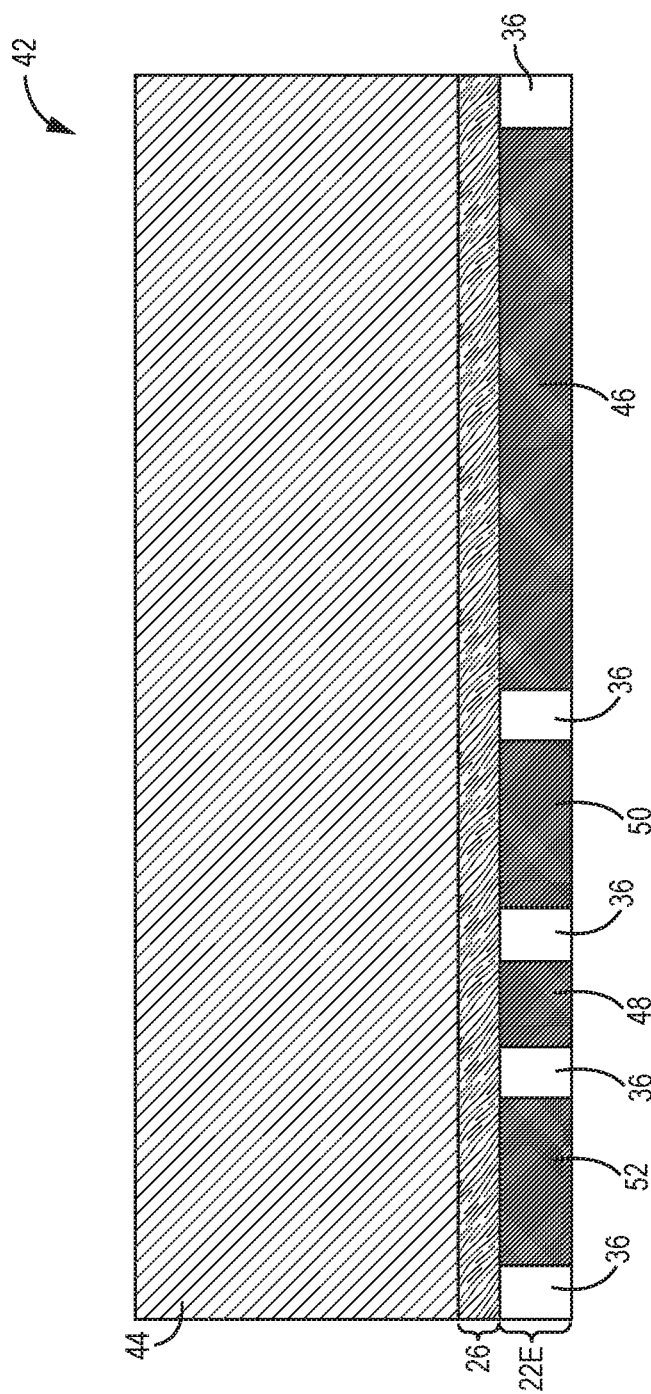

Initially, a silicon-on-insulator (SOI) structure 42 is provided as depicted in FIG. 4. The SOI structure 42 includes an epitaxy layer 22E, the BOX layer 26 over the epitaxy layer 22E, and a silicon handle layer 44 over the BOX layer 26. In detail, the epitaxy layer 22 includes a first sacrificial epitaxy section 46, a second sacrificial epitaxy section 48, a first active epitaxy section 50, a second active epitaxy section 52, and the isolation region 36. The isolation region 36 separates the first sacrificial epitaxy section 46, the second sacrificial epitaxy section 48, the first active epitaxy section 50, and the second active epitaxy section 52 from each other. The second sacrificial epitaxy section 48 is located between the first active epitaxy section 50 and the second active epitaxy section 52. The BOX layer 26 may be formed of silicon oxide or the like, which may serve as an etch stop in a process to remove the silicon handle layer 44 (more details in following discussion).

Figure 5B:
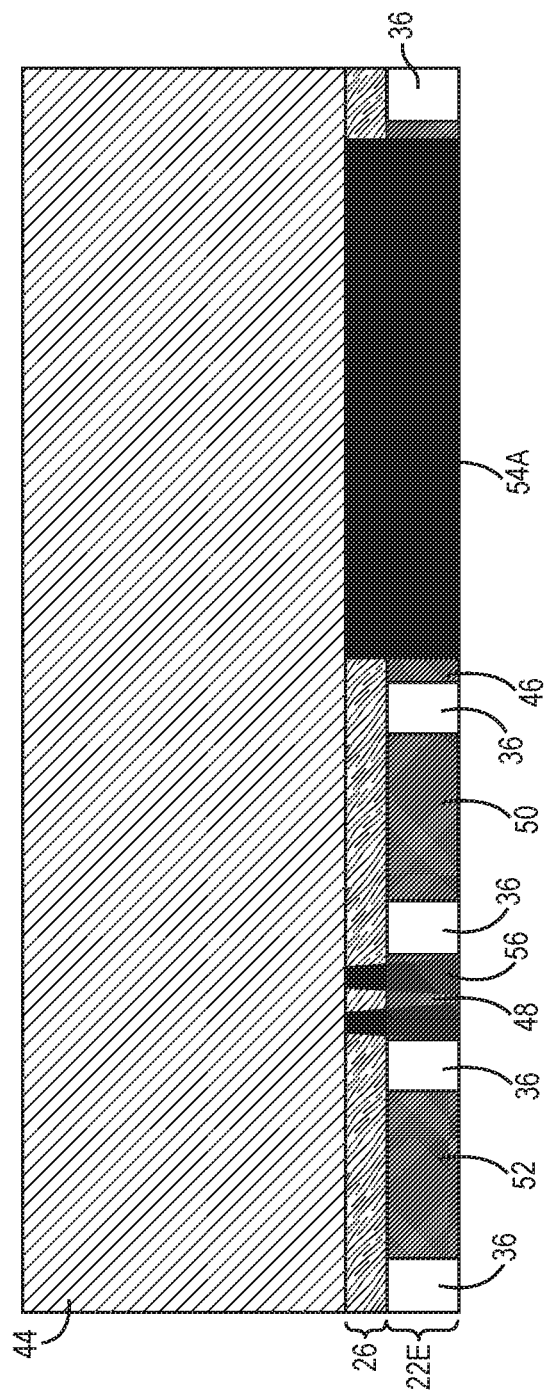

First etchable structures 54 and second etchable structures 56 are then formed as illustrated in FIG. 5A (only one first etchable structure and one second etchable structure are labeled with reference numbers for clarity). The first etchable structures 54 extend through the first sacrificial epitaxy section 46 and the BOX layer 26 to the silicon handle layer 44. In this embodiment, the first etchable structures 54 are an array configuration and distributed across the first sacrificial epitaxy section 46. The second etchable structures 56 extend through the second sacrificial epitaxy section 48 and the BOX layer 26 to the silicon handle layer 44. The second etchable structures 56 are distributed across the second sacrificial epitaxy section 48. The first etchable structures 54 and the second etchable structures 56 may be formed from polysilicon. In different applications, there may be fewer or more etchable structures extending through the sacrificial epitaxy sections. As illustrated in FIG. 5B, an alternative first etchable structure 54A that is formed through the first sacrificial epitaxy section 46 and the BOX layer 26 is a single monolithic structure.

Figure 6:
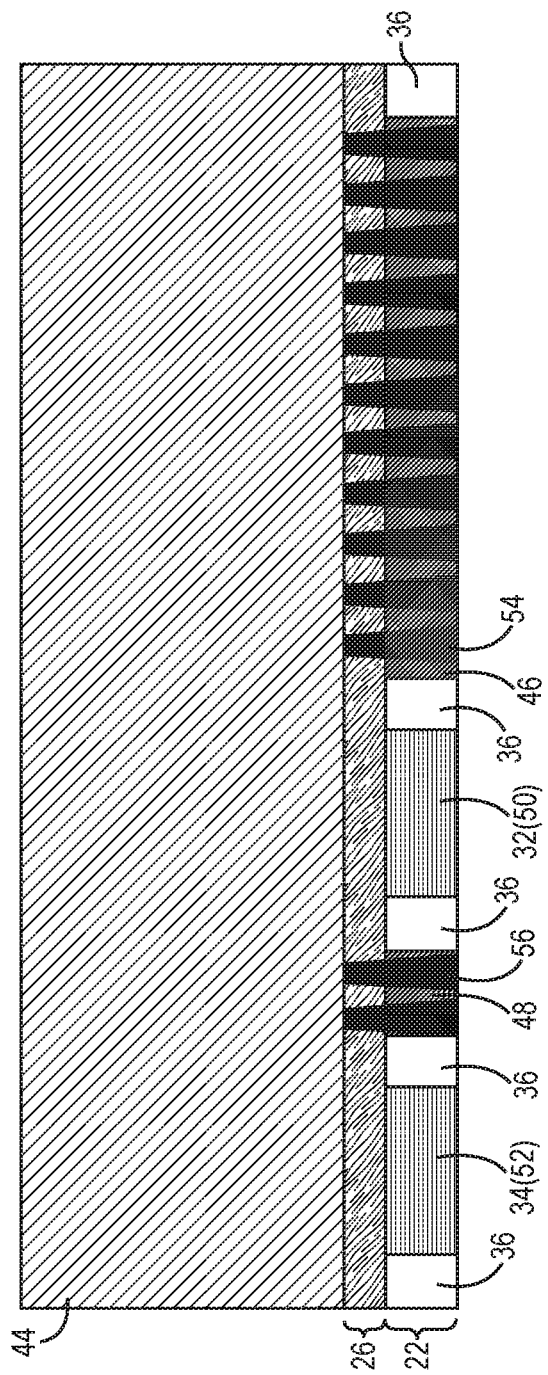
Figure 7:
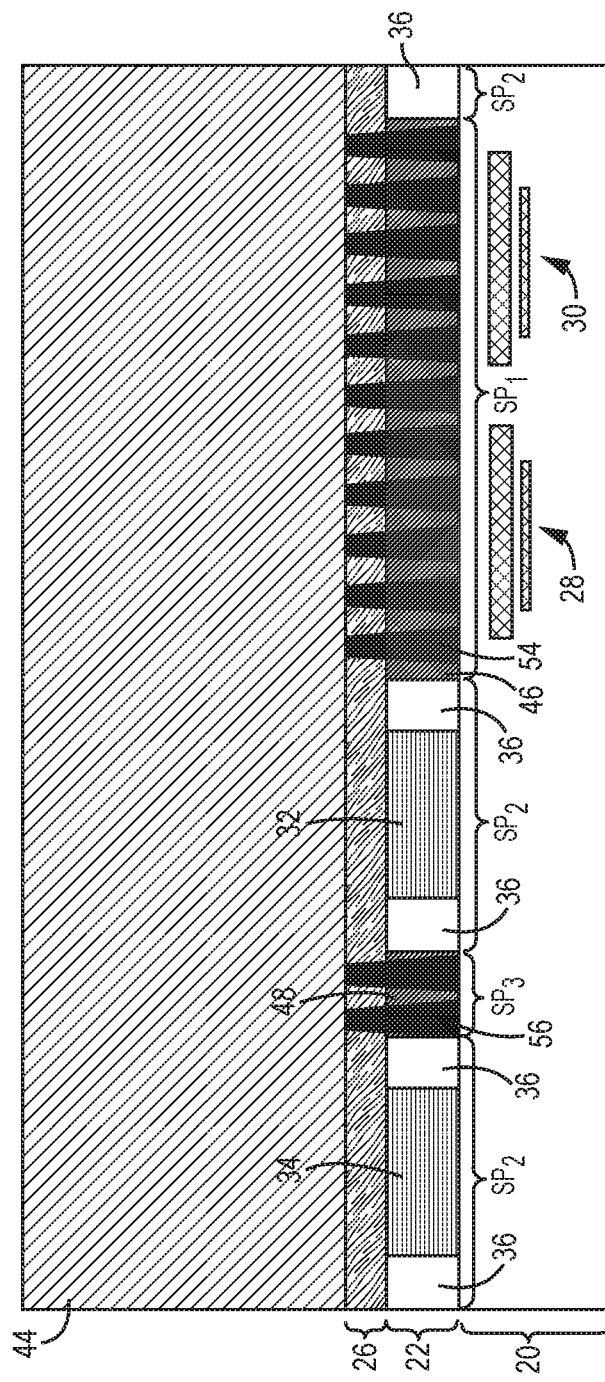
Figure 8:
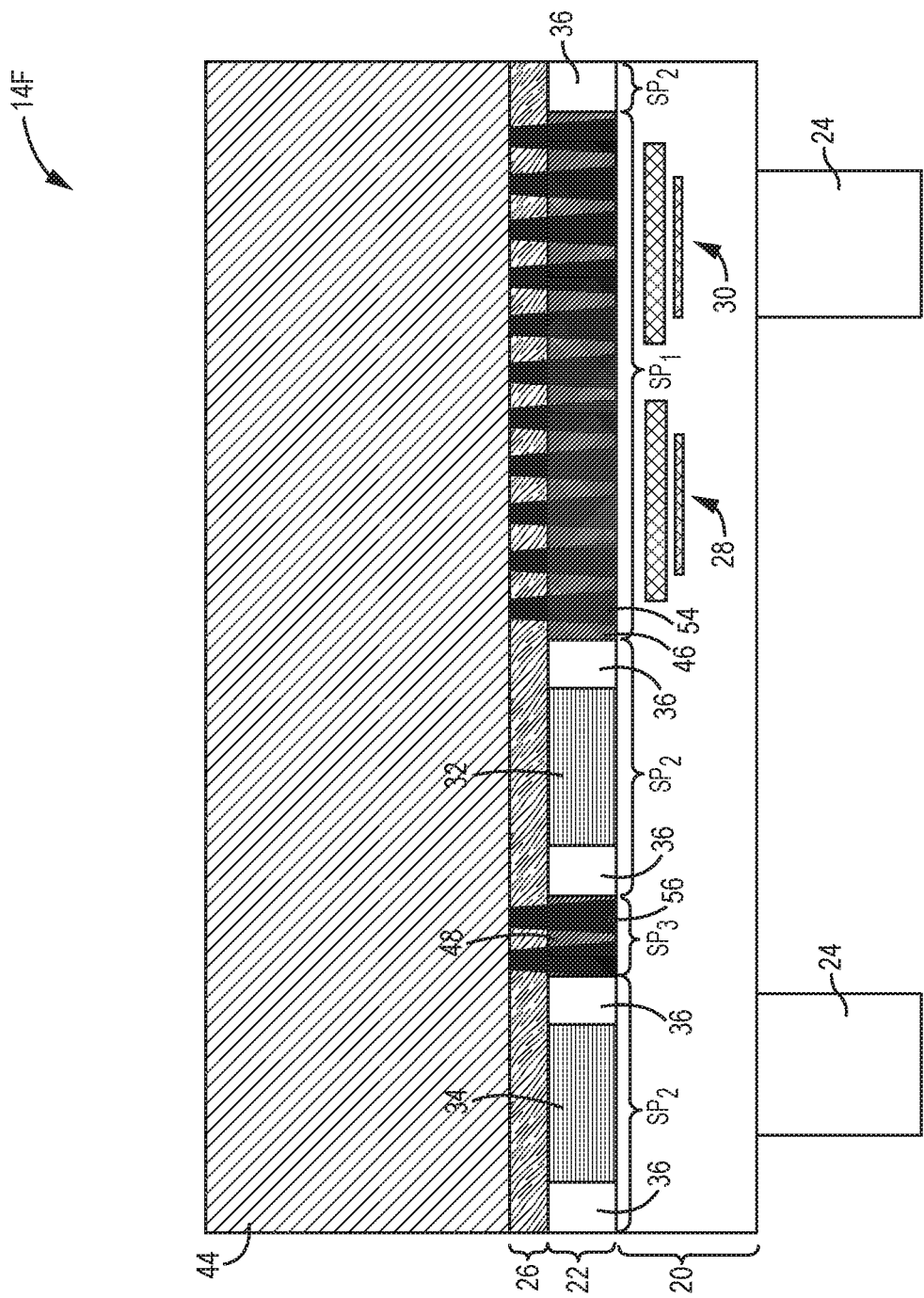

Next, the first active device 32 and the second active device 34 are integrated in or on the epitaxy layer 22E to form a device layer 22 as illustrated in FIG. 6. The first active device 32 is formed in or on the first active epitaxy section 50 and the second active device 34 is formed in or on the second active epitaxy section 52. FIG. 7 shows forming the BEOL layer 20 under the device layer 22. The upper surface of the BEOL layer 20 is in contact with a lower surface of the device layer 22. The upper surface of the BEOL layer 20 includes the first surface portion SP1, the second surface portion SP2, and the third surface portion SP3. The second surface portion SP2 surrounds the first surface portion SP1 and the third surface portion SP3, and the second surface portion SP2 separates the first surface portion SP1 from the third surface portion SP3. Herein, the first active device 32, the second active device 34, and the isolation region 36 are over the second surface portion SP2 and not over the first surface portion SP1 or the third surface portion SP3. In addition, the BEOL layer 20 includes the first passive device 28 and the second passive device 30. Both the first passive device 28 and the second passive device 30 are underlying the first surface portion SP1 and not underlying the second surface portion SP2. Then the interconnects 24 are formed at the lower surface of the BEOL layer 20 to complete a flip-chip die 14F as illustrated in FIG. 8.

Figure 9:
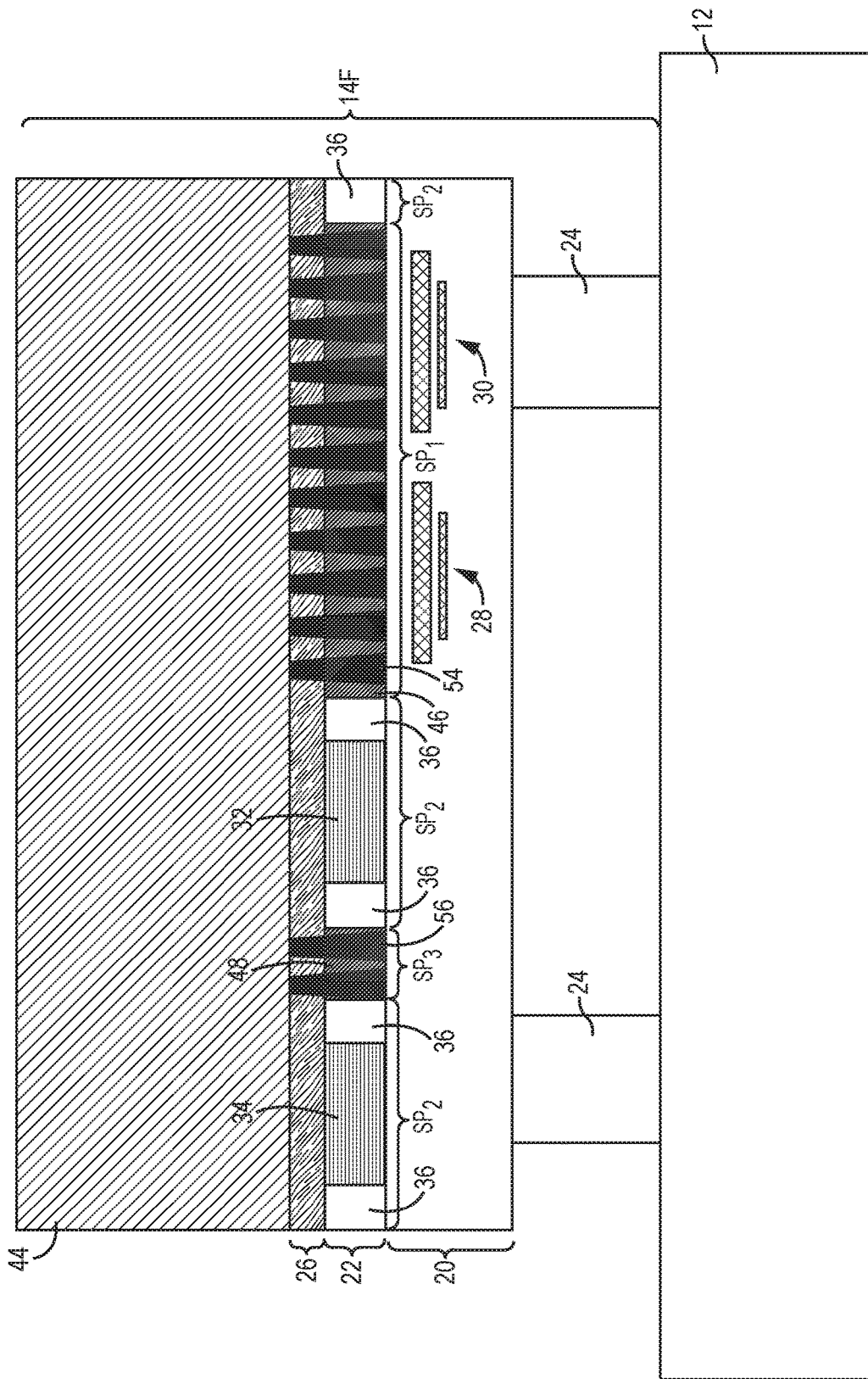
Figure 10:
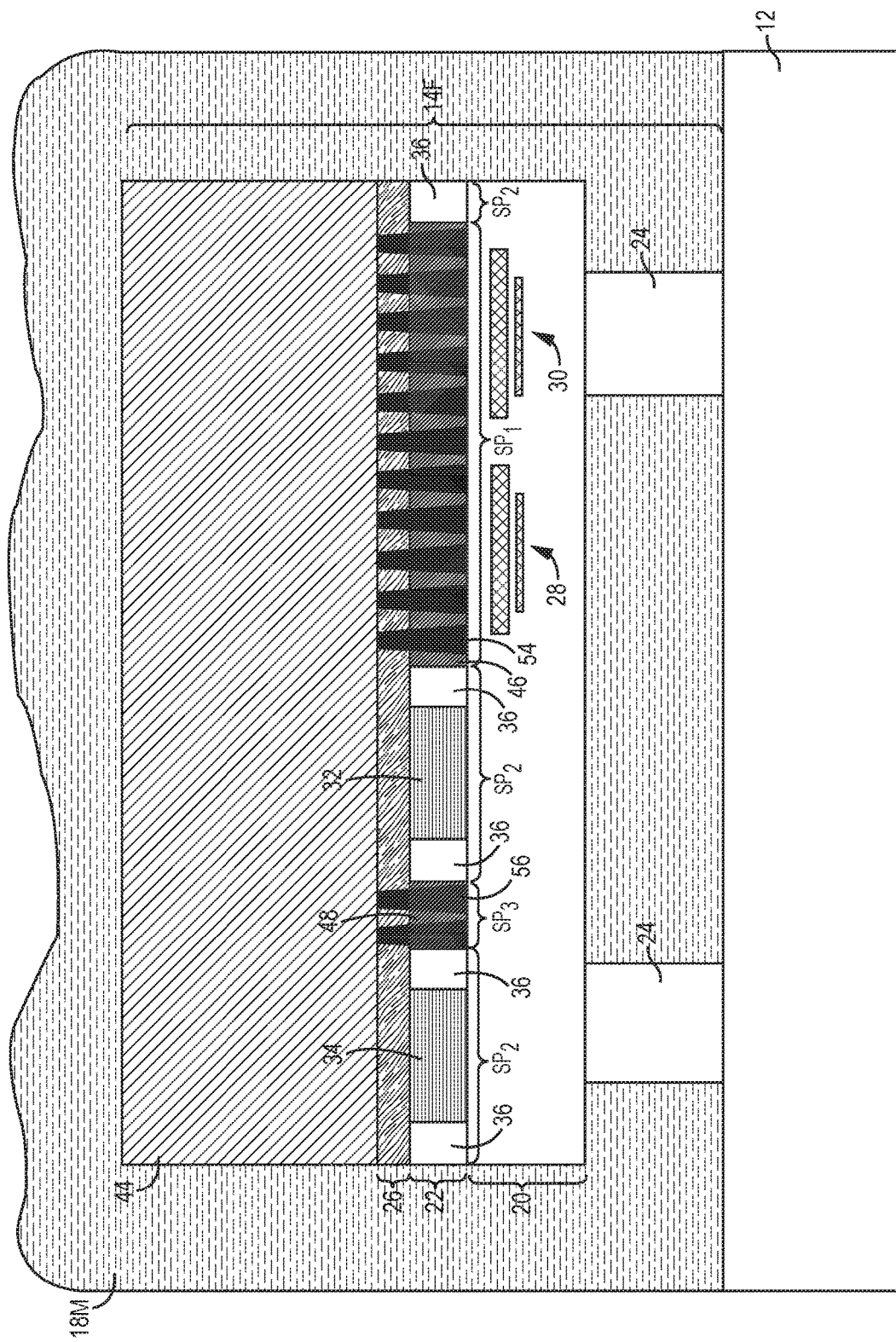

The flip-chip die 14F is then attached to the upper surface of the module substrate 12 as illustrated in FIG. 9. The interconnects 24 are extending from the lower surface of the BEOL layer 20 and coupled to the module substrate 12. Next, the second mold compound 18M is applied over the upper surface of the module substrate 12 such that the flip-chip die 14F is encapsulated by the second mold compound 18M as illustrated in FIG. 10. The second mold compound 18M may be applied by various procedures, such as sheet molding, overmolding, compression molding, transfer molding, dam fill encapsulation, and screen print encapsulation. The second mold compound 18M may be formed from an organic epoxy resin system or the like, such as Hitachi Chemical Electronic Materials GE-100LFC, which can be used as an etchant barrier to protect the flip-chip die 14F against etching chemistries such as potassium hydroxide (KOH), sodium hydroxide (NaOH), and acetylcholine (ACH). A curing process (not shown) is followed to harden the second mold compound 18M to form the second mold compound component 18. The curing temperature may be between 125° C. and 300° C. depending on which material is used as the second mold compound 18M.

Notice that, if the final semiconductor package 10 includes the underfilling layer 38, which is formed from a different material to the second mold compound 18M, there may be extra steps to form the underfilling layer 38 (not shown) before applying the second mold compound 18M over the upper surface of the module substrate 12. Forming the underfilling layer 38 is provided by applying an underfilling material over the upper surface of the module substrate 12 and then curing the underfilling material to form the underfilling layer 38. The underfilling layer 38 encapsulates the interconnects 24 and underfills the flip-chip die 14F between the lower surface of the BEOL layer 20 and the upper surface of the module substrate 12. The second mold compound 18M is then applied over the underfilling layer 38, and encapsulates at least the sides of the silicon handle layer 44, the sides of the BOX layer 26, the sides of the device layer 22, and the sides of the BEOL layer 20. A curing process (not shown) is followed to harden the second mold compound 18M to form the second mold compound component 18.

Figure 11:
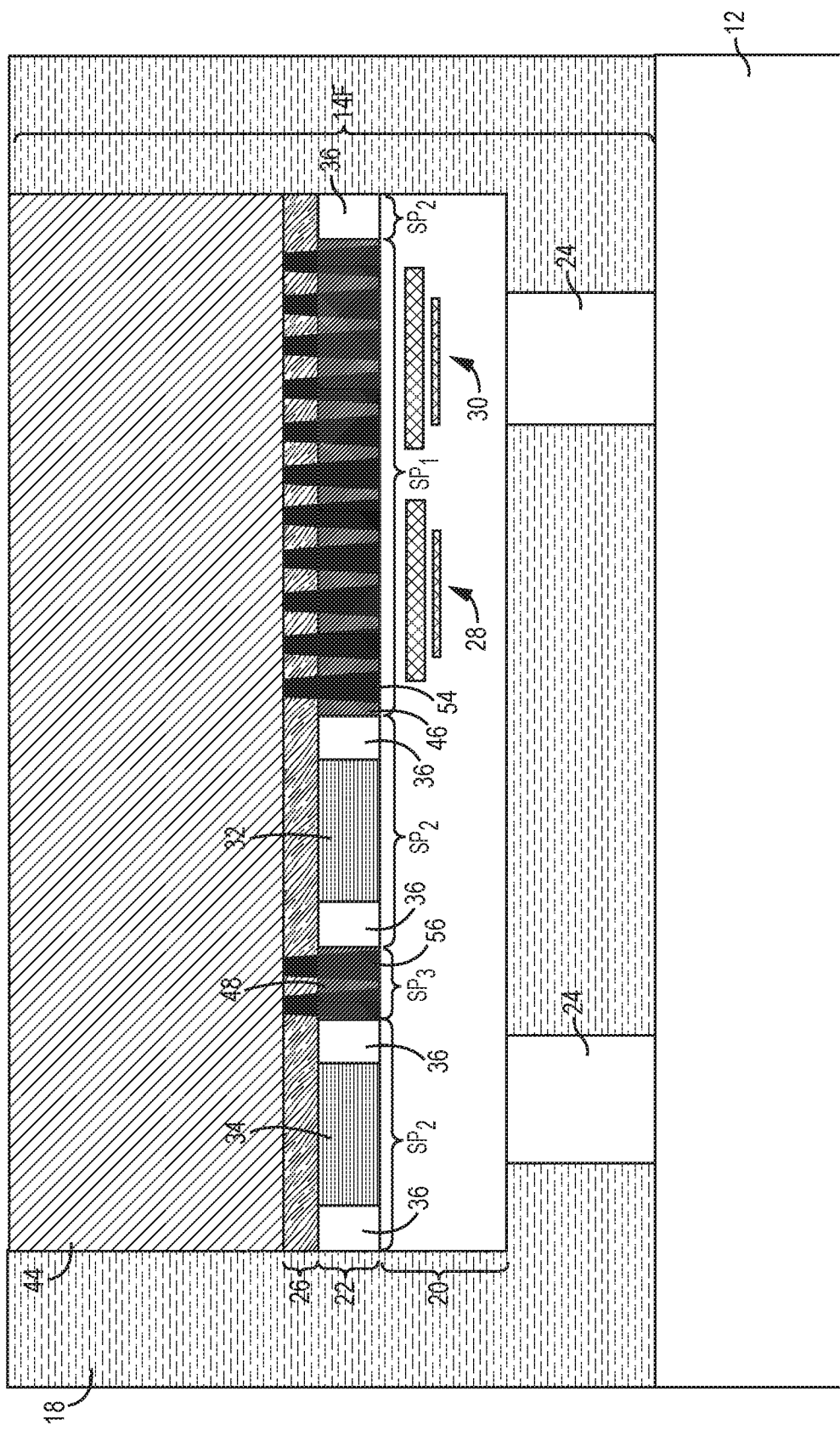
Figure 12:
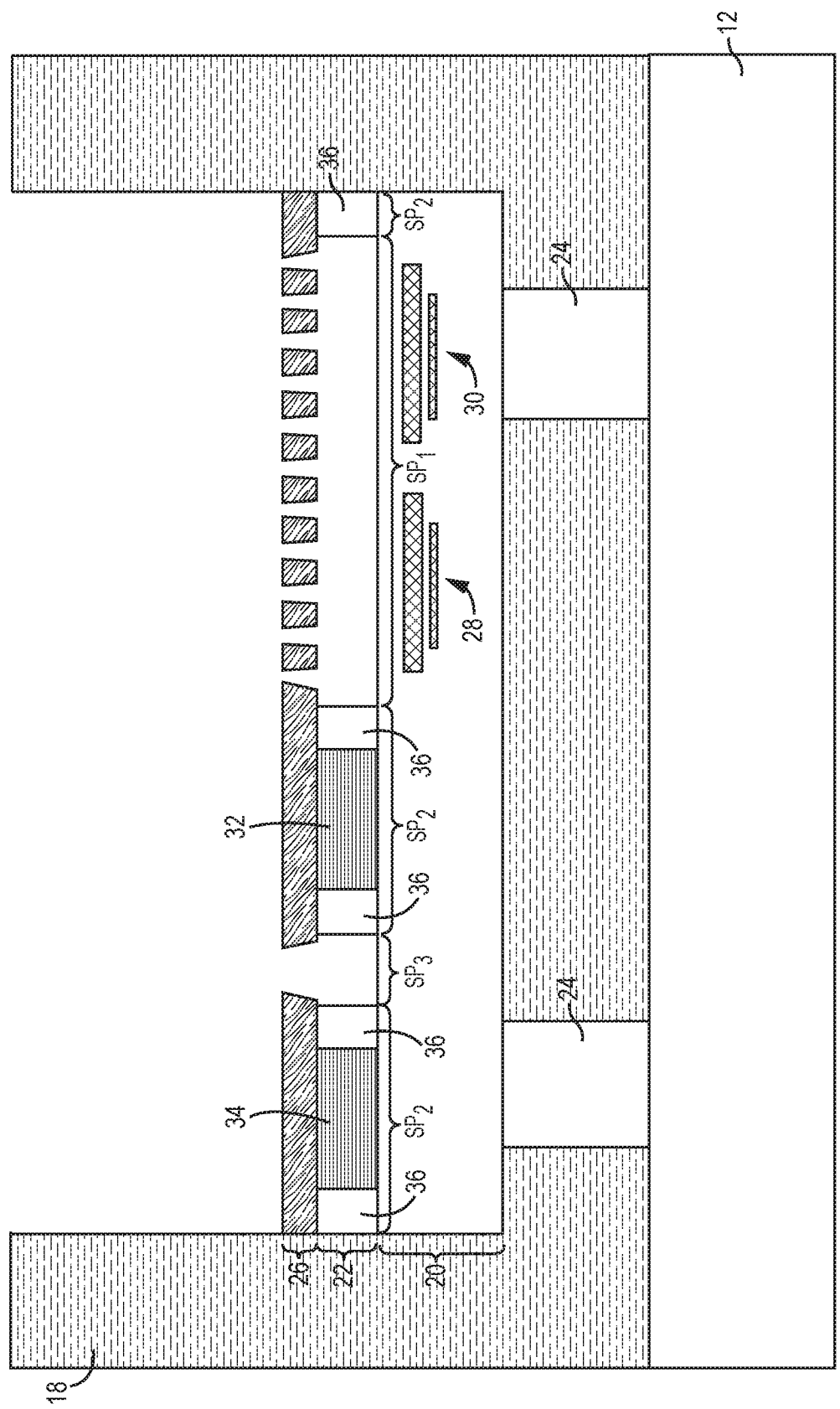
Figure 13:
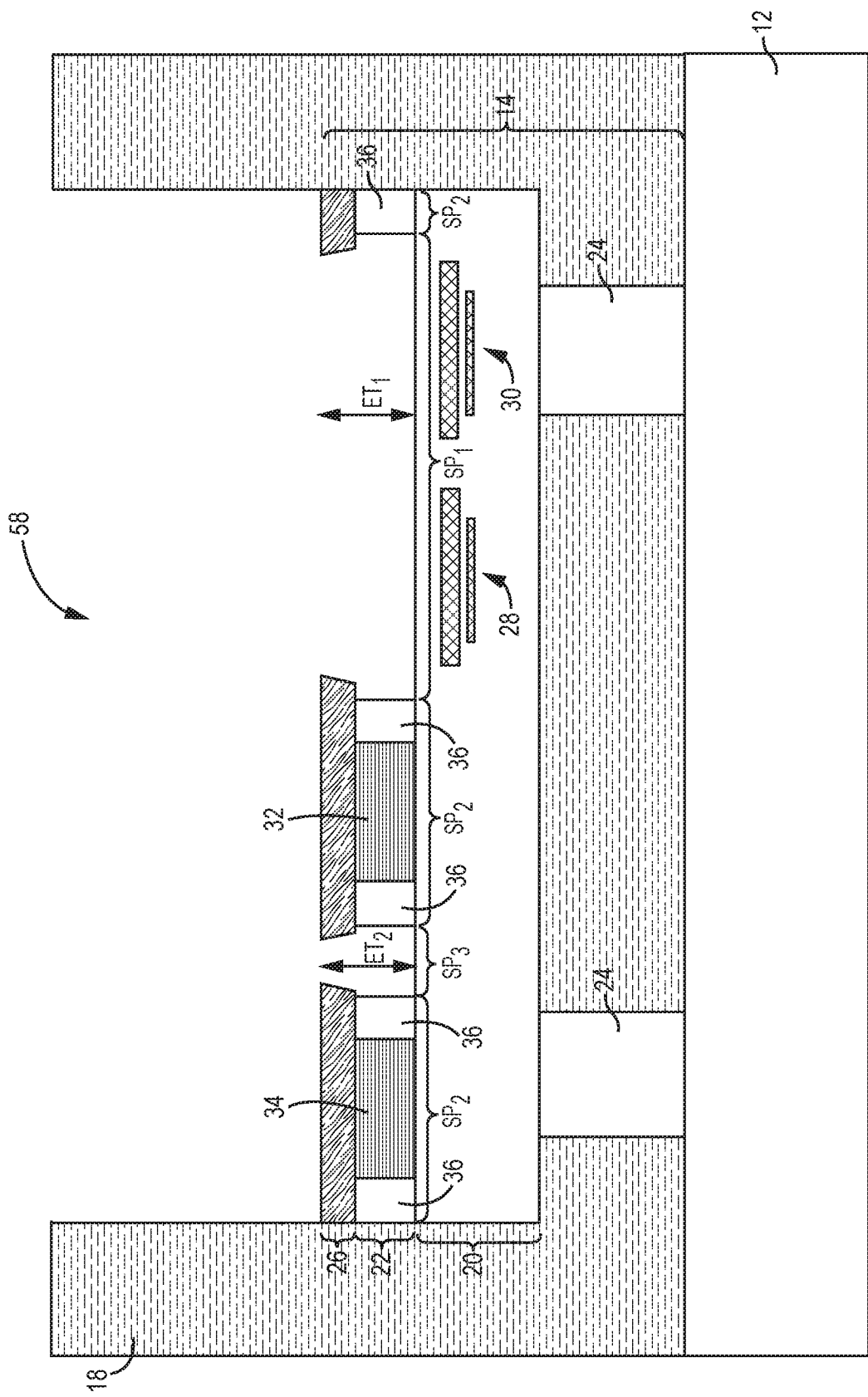

Next, the second mold compound component 18 is thinned down to expose the backside of the silicon handle layer 44 of the flip-chip die 14F, as shown in FIG. 11. The thinning procedure may be done with a mechanical grinding process. With reference to FIGS. 12 and 13, a process for providing the thinned flip-chip die 14 is illustrated according to one embodiment of the present disclosure. FIG. 12 shows the removal of the silicon handle layer 44, the first sacrificial epitaxy section 46, the second sacrificial epitaxy section 48, the first etchable structures 54, and the second etchable structures 56. The removing step may be provided by an etching process with a wet/dry etchant chemistry, which may be KOH, ACH, NaOH or the like. Normally, these wet/dry etchant chemistries may not etch away the BOX layer 26 and the BOX layer 26 may serve as an etch stop in the etching process. However, after removing the first etchable structures 54, a portion of the BOX layer 26 over the first surface portion SP1 includes a number of discrete and floating BOX pieces. Similarly, after removing the second etchable structures 56, another portion of the BOX layer 26 over the third surface portion SP3 may include at least one discrete and floating BOX piece. In some applications, there may be no floating BOX piece over the first surface portion SP1 or the third surface portion SP3. These discrete and floating BOX pieces can be easily removed to form the thinned flip-chip die 14 as illustrated as FIG. 13. Herein, a cavity 58 with a first extension ET1 and a second extension ET2 is formed, where the thinned flip-chip die 14 is located at the bottom of the cavity 58. The first extension ET1 of the cavity 58 extends through the BOX layer 26 and the device layer 22 to the first surface portion SP1 of the BEOL layer 20, and the second extension ET2 of the cavity 58 extends through the BOX layer 26 and the device layer 22 to the third surface portion SP3 of the BEOL layer 20.

Figure 14:
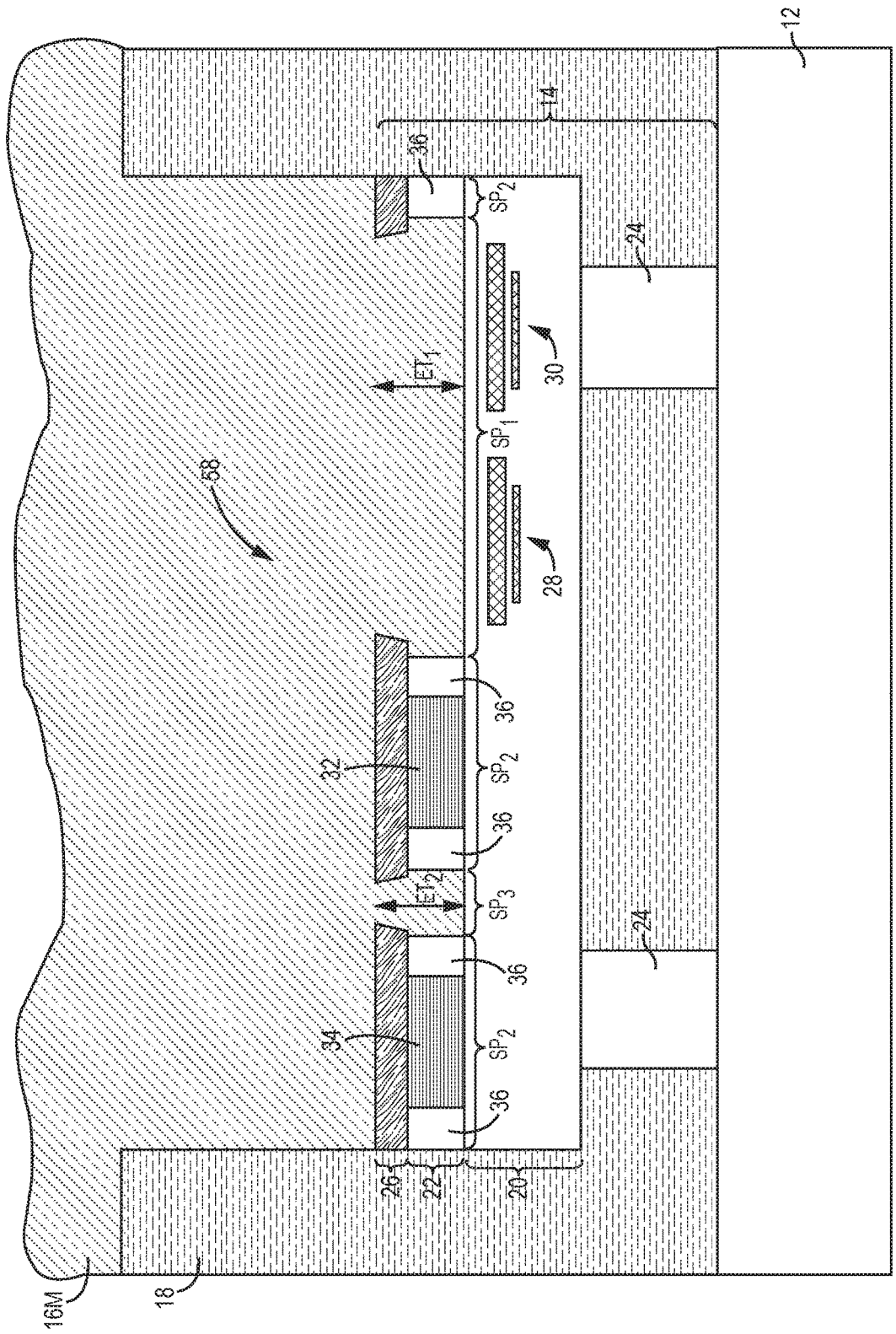

A first mold compound 16M is then applied to substantially fill the cavity 58 as illustrated in FIG. 14. The first mold compound 16M resides over the entirety of the thinned flip-chip die 14 and extends through the BOX layer 26 and the device layer 22 to the first surface portion SP1 and the third surface portion SP3 of the BEOL layer 20. As such, the first mold compound 16M resides over the first passive device 28 and the second passive device 30. Also, the first mold compound 16M separates the first active device 32 and the second active device 34, and resides over the first active device 32 and the second active device 34. A portion of the first mold compound 16M may reside over the upper surface of the second mold compound component 18. The first mold compound 16M may be applied by various procedures, such as sheet molding, overmolding, compression molding, transfer molding, dam fill encapsulation, and screen print encapsulation. A curing process (not shown) is followed to harden the first mold compound 16M to form the first mold compound component 16. The curing temperature is between 125° C. and 300° C. depending on which material is used as the first mold compound 16M.

Notice that, if the final semiconductor package 10 includes the thermally enhanced mold compound component 40, which is formed over the first mold compound component 16, there may be extra steps to form the thermally enhanced mold compound component 40 (not shown) after forming the first mold compound component 16. In this embodiment, the first mold compound component 16 does not fill the entire cavity 58. Instead, the first mold compound component 16 only fills a lower region of the cavity 58. The first mold compound 16M fills the first and second extensions ET1 and ET2 of the cavity 58 and extends over at least a portion of the BOX layer 26, which is over the first active device 32 and the second active device 34. Next, a thermally enhanced mold compound 40M is applied over the first mold compound component 16 and fills an upper region of the cavity 58. A curing process (not shown) is followed to harden the thermally enhanced mold compound 40M to form the thermally enhanced mold compound component 40. Herein, the second mold compound component 18 further encapsulates at least the sides of the thermally enhanced mold compound component 40.

Figure 15:
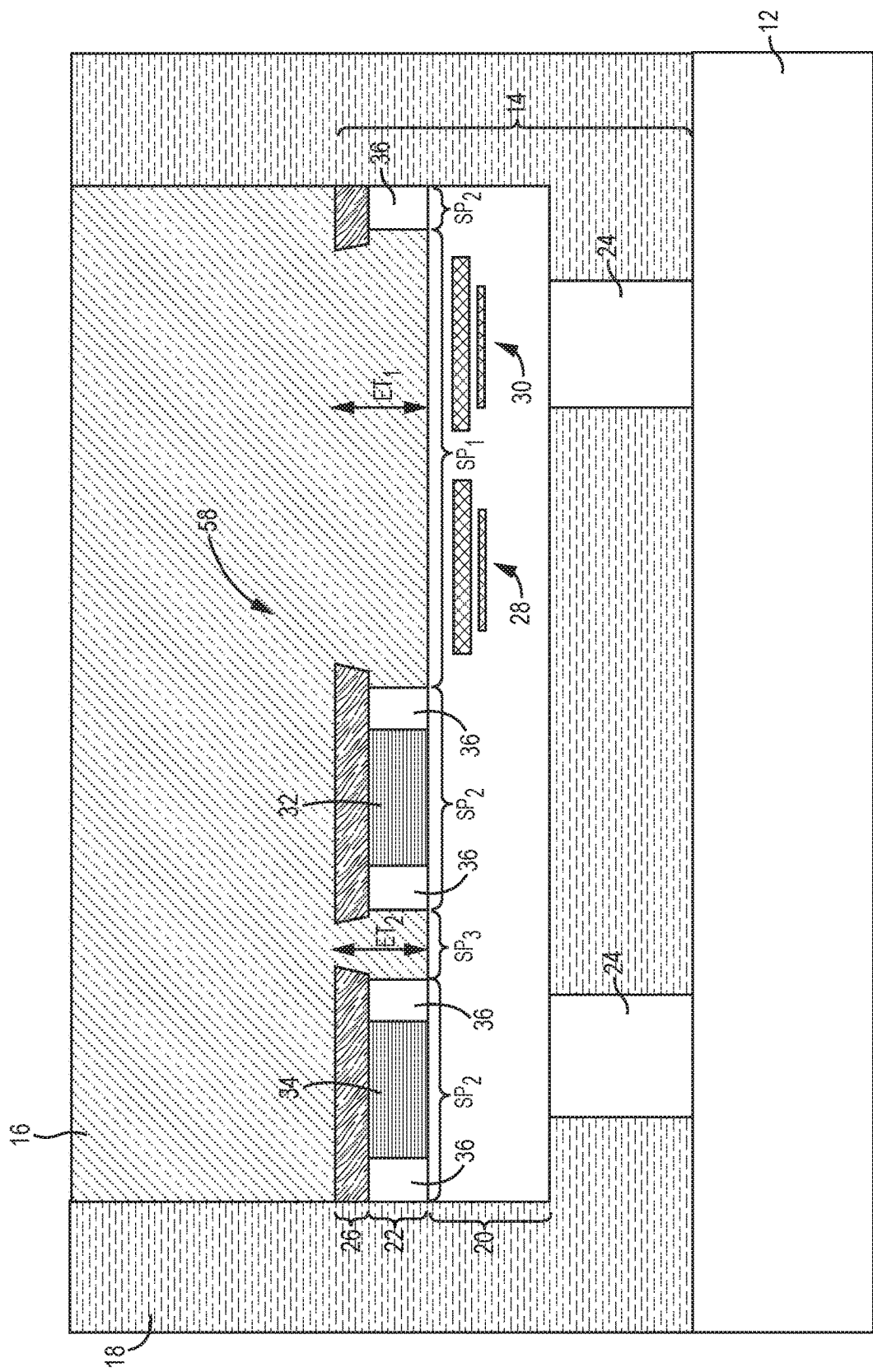

Finally, the upper surface of the first mold compound component 16 is planarized as illustrated in FIG. 15. A portion of the first mold compound component 16 may reside over the upper surface of the second mold compound component 18. A mechanical grinding process may be used for planarization.

Those skilled in the art will recognize improvements and modifications to the preferred embodiments of the present disclosure. All such improvements and modifications are considered within the scope of the concepts disclosed herein and the claims that follow.

What is claimed is:

1. A method comprising:
   providing a silicon-on-insulator (SOI) structure including an epitaxial layer, a buried oxide (BOX) layer over the epitaxial layer, and a silicon handle layer over the BOX layer, wherein:
   the epitaxial layer has a first sacrificial epitaxial section, a first active epitaxy section and an isolation region; and
   the isolation region surrounds the first active epitaxy section and separates the first active epitaxy section from the first sacrificial epitaxial section;
   forming at least one first etchable structure that extends through the first sacrificial epitaxial section and the BOX layer to the silicon handle layer;
   integrating a first active device in or on the first active epitaxy section, such that the epitaxial layer is formed as a device layer; and
   forming a (back-end-of-line) BEOL layer underlying the device layer, wherein:
   the BEOL layer has an upper surface including a first surface portion and a second surface portion surrounding the first surface portion;
   the first sacrificial epitaxial section is over the first surface portion and not over the second surface portion;
   the first epitaxy section and the isolation region are over the second surface portion and not over the first surface portion; and
   the BEOL layer comprises a first passive device and a second passive device, which are underlying the first surface portion and not underlying the second surface portion.

2. The method of claim 1 wherein the at least one first etchable structure is an array configuration and distributed across the first sacrificial epitaxy section.

3. The method of claim 1 wherein the at least one first etchable structure is a single monolithic structure.

4. The method of claim 1 wherein the at least one first etchable structure is formed from polysilicon.

5. The method of claim 1 further comprising:
   forming a plurality of interconnects that extend from a lower surface of the BEOL layer to complete a flip-chip die;
   attaching the flip-chip die to an upper surface of a module substrate, such that the plurality of interconnects is coupled to the upper surface of the module substrate;
   applying a barrier mold compound over the upper surface of the module substrate, such that the flip-chip die is encapsulated by the barrier mold compound; and
   curing the barrier mold compound to form a barrier mold compound component.

6. The method of claim 5 wherein applying the barrier mold compound is provided by at least one of a group consisting of sheet molding, overmolding, compression molding, transfer molding, dam fill encapsulation, and screen print encapsulation.

7. The method of claim 5 further comprising thinning down the barrier mold compound component to expose a backside of the silicon handle layer.

8. The method of claim 7 wherein thinning down the barrier mold compound component is provided by a mechanical grinding process.

9. The method of claim 8 further comprising removing the silicon handle layer, the at least one first etchable structure, and the first sacrificial epitaxial section, such that a cavity with a first extension is formed within the barrier mold compound component, wherein the first extension of the cavity extends through the BOX layer and the device layer to the first surface portion of the BEOL layer.

10. The method of claim 9 wherein removing the silicon handle layer, the at least one first etchable structure, and the first sacrificial epitaxial section is provided by an etching process with a wet/dry etchant chemistry.

11. The method of claim 9 further comprising:
applying a low dielectric mold compound to substantially fill the cavity within the barrier mold compound component, such that the low dielectric mold compound extends through the BOX layer and the device layer to the first surface portion of the BEOL layer; and
curing the low dielectric mold compound to form a low dielectric mold compound component.

12. The method of claim 11 wherein applying the low dielectric mold compound is provided by at least one of a group consisting of sheet molding, overmolding, compression molding, transfer molding, dam fill encapsulation, and screen print encapsulation.

13. The method of claim 11 wherein the low dielectric mold compound component has a dielectric constant no more than 7.

14. The method of claim 11 wherein the low dielectric mold compound component has a dielectric constant no more than 4.

15. The method of claim 11 wherein the low dielectric mold compound component and the barrier mold compound component are formed from an identical material.

16. The method of claim 11 wherein the low dielectric mold compound component and the barrier mold compound component are formed from different materials.

17. The method of claim 1 wherein the first passive device and the second passive device are metal-insulator-metal (MIM) capacitors.

18. The method of claim 1 wherein the first active device is a field effect transistor (FET).

19. The method of claim 1 wherein:
the epitaxial layer further includes a second sacrificial epitaxial section, and a second active epitaxy section, wherein:
the isolation region separates the first sacrificial epitaxy section, the second sacrificial epitaxy section, the first active epitaxy section, and the second active epitaxy section from each other; and
the second sacrificial epitaxy section is located between the first active epitaxy section and the second active epitaxy section;
at least one second etchable structure is formed, wherein the at least one second etchable structure extends through the second sacrificial epitaxial section and the BOX layer to the silicon handle layer;
a second active device is integrated in or on the second active epitaxy section; and
the upper surface of the BEOL layer further includes a third surface portion that is surrounded by the second surface portion and separated from the first surface portion, wherein:
the first active device, the second active device, and the isolation region are over the second surface portion, not over the first surface portion or the third surface portion;
the first sacrificial epitaxial section is over the first surface portion, not over the second surface portion or the third surface portion; and
the second sacrificial epitaxial section is over the third surface portion, not over the first surface portion or the second surface portion.

20. The method of claim 19 further comprising:
forming a plurality of interconnects that extend from a lower surface of the BEOL layer to complete a flip-chip die;
attaching the flip-chip die to an upper surface of a module substrate, such that the plurality of interconnects is coupled to the upper surface of the module substrate;
applying a barrier mold compound over the upper surface of the module substrate, such that the flip-chip die is encapsulated by the barrier mold compound;
curing the barrier mold compound to form a barrier mold compound component;
thinning down the barrier mold compound component to expose a backside of the silicon handle layer;
removing the silicon handle layer, the at least one first etchable structure, the first sacrificial epitaxial section, the at least one second etchable structure, and the second sacrificial epitaxial section, such that a cavity with a first extension and a second extension is formed within the barrier mold compound component, wherein the first extension of the cavity extends through the BOX layer and the device layer to the first surface portion of the BEOL layer, and the second extension of the cavity extends through the BOX layer and the device layer to the third surface portion of the BEOL layer;
applying a low dielectric mold compound to substantially fill the cavity within the barrier mold compound component, such that the low dielectric mold compound extends through the BOX layer and the device layer to the first surface portion of the BEOL layer and extends through the BOX layer and the device layer to the third surface portion of the BEOL layer; and
curing the low dielectric mold compound to form a low dielectric mold compound component.

* * * * *